United States Patent [19]
Prancz

[11] Patent Number: 6,095,424
[45] Date of Patent: *Aug. 1, 2000

[54] CARD-SHAPED DATA CARRIER FOR CONTACTLESS USES, HAVING A COMPONENT AND HAVING A TRANSMISSION DEVICE FOR THE CONTACTLESS USES, AND METHOD OF MANUFACTURING SUCH CARD-SHAPED DATA CARRIERS, AS WELL AS A MODULE THEREFOR

[75] Inventor: Markus Prancz, Vienna, Austria

[73] Assignee: Austria Card Plasikkarten und Ausweissysteme Gesellschaft m.b.H., Vienna, Austria

[ * ] Notice: This patent issued on a continued prosecution application filed under 37 CFR 1.53(d), and is subject to the twenty year patent term provisions of 35 U.S.C. 154(a)(2).

[21] Appl. No.: 09/011,153

[22] PCT Filed: Jul. 15, 1996

[86] PCT No.: PCT/IB96/00691

§ 371 Date: Jan. 29, 1998

§ 102(e) Date: Jan. 29, 1998

[87] PCT Pub. No.: WO97/05570

PCT Pub. Date: Feb. 13, 1997

[30] Foreign Application Priority Data

Aug. 1, 1995 [AT] Austria .................................. 422/95 U

[51] Int. Cl.[7] .................................................. G06K 19/06
[52] U.S. Cl. .......................... 235/492; 235/486; 343/741; 257/679
[58] Field of Search ..................................... 235/492, 486, 235/487, 491, 380; 902/26; 343/741, 742, 743, 744; 257/679

[56] References Cited

U.S. PATENT DOCUMENTS

| 5,550,709 | 8/1996 | Iwasaki | 235/492 X |
| 5,598,032 | 1/1997 | Fidalgo | 235/492 X |
| 5,612,532 | 3/1997 | Iwasaki | 235/492 |
| 5,671,525 | 9/1997 | Fidalgo | 235/492 X |
| 5,710,458 | 1/1998 | Iwasaki | 235/491 X |
| 5,822,190 | 10/1998 | Iwasaki | 235/488 X |

FOREIGN PATENT DOCUMENTS

0682321A2  11/1995  European Pat. Off. .

*Primary Examiner*—Michael G Lee
*Attorney, Agent, or Firm*—Laurie E. Gathman

[57] ABSTRACT

In a data carrier (46) for contactless uses having at least one component (31) and at least one transmission device (2) for the contactless uses the card body (14) has dimensions corresponding to the dimensions of a card body of a card-shaped data carrier for contact-bound uses in accordance with the standard ISO 7810, and the card body (14) has a recess (17) which terminates in a body main surface (15), in which recess the component (31) has been mounted, which recess is situated in the card body (14) of the card-shaped data carrier (46) at a position which corresponds to the position of a contact surface, comprising contacts, on a card-shaped data carrier for contact-bound uses in accordance with the standard ISO 7816-2, and the component connecting contacts (55, 56) of the component (31) have been connected in an electrically conductive manner to transmission-device connecting contacts (4, 5) of a transmission device (2) incorporated in the card body (14) before the component (31) is mounted in the recess (17) of the card body (14).

33 Claims, 6 Drawing Sheets

CARD-SHAPED DATA CARRIER FOR CONTACTLESS USES, HAVING A COMPONENT AND HAVING A TRANSMISSION DEVICE FOR THE CONTACTLESS USES, AND METHOD OF MANUFACTURING SUCH CARD-SHAPED DATA CARRIERS, AS WELL AS A MODULE THEREFOR

BACKGROUND OF THE INVENTION

The invention relates to a card-shaped data carrier for contactless uses, comprising a card body having a body main surface and having dimensions corresponding to the dimensions of a card body of a card-shaped data carrier for contact-bound uses in accordance with the standard ISO 7810, and incorporating at least one component for the contactless uses, which component has component connecting contacts, and at least one transmission device for the contactless uses, which transmission device has transmission-device connecting contacts, the component connecting contacts being connected to the transmission-device connecting contacts in an electrically conductive manner.

The invention further relates to a method of manufacturing a data carrier for contactless uses, in which a card body having a body main surface is manufactured, which card body has dimensions corresponding to the dimensions of a card-shaped data carrier for contact-bound uses in accordance with the standard ISO 7810, and in which during the manufacture of the card body at least one component intended for the contactless uses and having component connecting contacts, and at least one transmission device having transmission-device connecting contacts are incorporated in the card body.

The invention further relates to a module adapted for use in a data carrier which comprises a plate-shaped component carrier bounded by a first carrier main surface and a second carrier main surface parallel to the first carrier main surface, and a component connected to the component carrier and projecting from the second carrier main surface, and at least two module connecting contacts connected to the component carrier, situated in the area of the second carrier main surface and adapted to cooperate with transmission-device connecting contacts.

Card-shaped data carriers, modules and manufacturing methods related to the general types referenced above are known, such as card-shaped data carriers implemented in several variants for a variety of uses, for example, in the form of access control cards for the automatic opening of doors.

During the manufacture of the known card-shaped data carrier for contactless uses, a component for contactless uses, formed by a chip, is attached to a component carrier and the component connecting contacts are connected to the module connecting contacts in an electrically conductive manner by means of bonding wires, as a result of which a module for contactless uses is obtained, which module is assembled with a transmission device in the form of a coil to form a so-called transponder unit, the module connecting contacts and the coil connecting contacts provided as transmission-device connecting contacts being connected to one another, for example, by means of a so-called bonding process. A transponder unit thus obtained is subsequently incorporated in the card body during the manufacture of the card-shaped data carrier, the positions of the transponder unit and its parts, i.e. the module, its component and the coil, not being subject to any special regulations or conditions to be observed and adhered to. The known card-shaped data carrier for contactless uses has the problem that the coil provided as the transmission device is connected to the module and thus to the chip forming the component before mounting in the card body of the data carrier, as a result of which it must be manipulated together with the module during the production of the data carrier, which entails the risk of damaging of the coil which forms the transmission device. This has the drawback that in the case of such damage to the coil during the production of the data carrier an inoperative data carrier is obtained, but this cannot be checked until the data carrier has been completed. Furthermore, the known data carrier for contactless uses has the problem that for its production a dedicated production method is required and that for carrying out this production method machines and equipment have to be used which are only suitable for this production method. This is undesirable particularly in view of the fact that a data carrier manufacturer not only manufactures card-shaped data carriers for contactless uses but also data carriers for contact-bound uses, in which case the data carrier manufacturer requires and employs both machines and equipment for the production of contactless data carriers and machines and equipment for the production of contact-bound data carriers.

SUMMARY OF THE INVENTION

It is an object of the invention to preclude or at least substantially mitigate the afore-mentioned problems and drawbacks and to provide an improved card-shaped data carrier of the type defined above and an improved method of the type defined above.

According to the invention, in order to achieve the afore-mentioned object, a card-shaped data carrier of the general type indicated above is characterized in that the card body has a recess which terminates in said body main surface and the component for the contactless uses has been mounted in said recess, and the recess in the card body is situated in the card-shaped data carrier for contactless uses at a position which corresponds to the position of a contact surface, which consists of contacts, on a card-shaped data carrier for contact-bound uses in accordance with the standard ISO 7816-2, and the component connecting contacts of the component are connected in an electrically conductive manner to the transmission-device connecting contacts of a transmission device incorporated in the card body before the component is mounted in the recess of the card body. Thus, a data carrier for contactless uses in accordance with the invention can be manufactured substantially without rejects as a result of a defective transmission device, which is advantageous for a low-cost production of a such a data carrier, and that a data carrier in accordance with the invention for contactless uses can be manufactured using machines and equipment known for the production of card-shaped data carriers for contact-bound uses, so that said machines and equipment serve a double purpose and, therefore, in addition only machines and equipment for the production of the transmission device of such a data carrier for contactless uses are needed for the production of a card-shaped data carrier in accordance with the invention. Owing to the measures in accordance with the invention a data carrier in accordance with the invention for contactless uses can be manufactured in a facile manner.

In a data carrier in accordance with the invention the component alone may be placed and encapsulated in the recess of the card body and the component connecting contacts may be connected directly to the transmission-device connecting contacts both mechanically and electrically. However, it has proved to be particularly advantageous if the component forms part of a module for the contactless uses, which module comprises a plate-shaped component carrier and the component carried by this component carrier and the module connecting contacts which have been connected to the component connecting contacts in an electrically conductive manner, and the module for the contactless uses has been mounted in the recess, and the module connecting contacts of the module have been connected to the transmission-device connecting contacts in an electrically conductive manner. In this way, the component for contactless uses can be mounted in the recess of a card body by employing the module for contactless uses and can be mounted in substantially the same way as a module for contact-bound uses, so that the component for contactless uses can be mounted, using the module for contactless uses, with the aid of a device for the placement of modules for contact-bound uses, which is advantageous for low-cost production.

In a data carrier in accordance with the invention as defined in the preceding paragraph it has further proved to be advantageous if the plate-shaped component carrier has a first carrier main surface, which faces said body main surface, and a second carrier main surface, which is remote from said body main surface and extends substantially parallel to the first carrier main surface, and the module connecting contacts of the module are connected to the component carrier in the area of the second carrier main surface, and each module connecting contact of the module is disposed opposite a transmission-device connecting contact in a direction transverse to the second carrier main surface and two oppositely disposed connecting contacts are connected to one another in an electrically conductive manner. Such an embodiment has proved to be advantageous for a simple interconnection of the module connecting contacts and the transmission-device connecting contacts.

In a data carrier in accordance with the invention as defined in the preceding paragraph it has further proved to be advantageous if the module connecting contacts of the module project from the second carrier main surface of the component carrier and extend up to the transmission-device connecting contacts of the transmission device. Such an embodiment has proved to be very favorable for a low-cost production because during production of such a data carrier the module connecting contacts can be connected automatically to the transmission-device connecting contacts in an electrically conductive manner without any additional measures.

In a data carrier in accordance with the invention as defined in the preceding paragraph it has further proved to be very advantageous if in a bottom area of the recess, which area is remote from said body main surface, passages have been formed which extend from the recess to the transmission-device connecting contacts, through which passages the module connecting contacts which project from the second carrier main surface of the component carrier are connected to the transmission-device connecting contacts in an electrically conductive manner. Such an embodiment has proved to be very advantageous for low-cost production, the formation of the passages requiring only a minimal expense.

In a data carrier in accordance with the invention as defined in the preceding paragraph it has proved to be very advantageous if the recess and the passages giving access to the transmission-device connecting contacts have been formed by means of a milling operation. This is particularly advantageous for a high-precision fabrication of the recess for the module and the passages to the transmission-device connecting contacts.

In a data carrier in accordance with the invention having passages which extend from the recess to the transmission-device connecting contacts it has proved to be particularly advantageous if an electrically conductive adhesive has been provided in the passages, by means of which adhesive the module connecting contacts and the transmission-device connecting contacts are connected to one another in an electrically conductive manner. This results in a particularly reliable electrical connection between the transmission-device connecting contacts and the module connecting contacts.

In a data carrier in accordance with the invention comprising a plate-shaped component carrier having a first carrier main surface and a second carrier main surface, it has also proved to be very advantageous if the module connecting contacts of the module are essentially disposed in the level zone of the second carrier main surface, and between each module connecting contact of the module and the opposite transmission-device connecting contact of the transmission device in a direction transverse to the second carrier main surface a channel is formed, which channel is enclosed by the card body over its whole length, adjoins the two connecting contacts and contains an electrically conductive connecting means for the electrically conductive connection of the two adjoining connecting contacts. Such a data carrier in accordance with the invention has the advantage that it allows the use of module of a customary type, particularly with respect to the construction of the module connecting contacts. Moreover, such an embodiment has also proved to be favorable in view of low-cost production.

In a data carrier in accordance with the invention having channels between the module connecting contacts and the transmission-device connecting contacts, it has proved to be particularly advantageous if the data carrier has a stepped recess which terminates in said body main surface and has a cross-sectionally larger first recess portion, which adjoins said carrier main surface and is bounded by an annular bounding surface substantially parallel to said body main surface, and a cross-sectionally smaller second recess portion, which adjoins the first recess portion at the side which is remote from said body main surface and which accommodates the module, an annular portion of the second carrier main surface of the component carrier of the module facing the annular bounding surface of the first recess portion, and the module connecting contacts are disposed at least partly in the area of the annular portion of the second carrier main surface, and the channels extend from the annular bounding surface of the first recess portion up to the transmission-device connecting contacts through the card body. In practice, such am embodiment has proved to be particularly advantageous because it provides comparatively much freedom as regards the positioning of the transmission-device connecting contacts in a card body.

In a data carrier in accordance with the invention as defined in the preceding paragraph it has further proved to be very advantageous if the recess and the channels are formed by means of a milling process. This is particularly advantageous for a high-precision fabrication of the recess for the module and the channels to the transmission-device connecting contacts.

In a data carrier in accordance with the invention having channels between the module connecting contacts and the transmission-device connecting contacts, it has also proved to be particularly advantageous if each channel contains an electrically conductive adhesive as the electrically conductive connecting means. In this way, it is achieved that the connecting means form not only the electrical connection but also a proper and stable adhesive mechanical connection which secures the module to the card body of the data carrier via the module connecting contacts.

In a data carrier in accordance with the invention as defined in the preceding paragraph, it has proved to be particularly advantageous if at its end which is remote from its adjacent transmission-device connecting contact each channel is provided with a pocket which extends in a lateral direction away from the channel and which is adapted to receive a surplus amount of electrically conductive adhesive. In this way, it is achieved that any surplus of electrically conductive adhesive introduced into a channel can be taken up in the pocket which extends away from the channel in a lateral direction, thereby precluding soiling as a result of the introduction of a surplus of electrically conductive adhesive introduced into a channel.

In all the data carriers in accordance with the invention defined hereinbefore the transmission device can be a capacitively operating device. However, it has proved to be particularly advantageous if the transmission device is formed by a coil. The advantage of such a transmission device formed by a coil mainly resides in the fact that such a coil is suitable both for the transmission of data between the data carrier and a transmission/receiving device and for the transmission of power to the data carrier.

In a data carrier in accordance with the invention as defined in the preceding paragraph it has proved to be very advantageous if the coil turns and the coil connecting contacts of the coil provided as transmission-device connecting contacts are constituted by conductor tracks formed in a screen-printing process. In this way, the advantages of screen-printing processes, whose use for the manufacture of coils for data carriers is known per se, can also be utilized favorably in a data carrier in accordance with the invention.

In the context given above it has further proved to be very advantageous if the coil turns and the coil connecting contacts of the coil provided as transmission-device connecting contacts are constituted by conductor tracks formed in a screen-printing process using a conductive silver paste. This has proved to be particularly favorable in practice.

In all the data carriers in accordance with the invention defined hereinbefore it has proved to be particularly advantageous if the card body having the recess is a laminated card body. This is particularly advantageous for mounting the transmission device.

Furthermore, it has proved to be advantageous in all the data carriers in accordance with the invention as defined hereinbefore if the module of the data carrier is intended exclusively for contactless uses. Such a data carrier has proved to be particularly easy and convenient to handle.

According to the invention, in order to achieve the aforementioned object, a method of the general type indicated above is characterized in that before the component is mounted in a recess in the card body a transmission device which is separate from the component is incorporated in the card body, and a recess is formed in the manufactured card body by material removal, which recess terminates in said body main surface and is situated at a position which corresponds to the position of a contact surface, which consists of contacts, on a card-shaped data carrier for contact-bound uses in accordance with the standard ISO 7816-2, and the component for the contactless uses is mounted in said recess, and the component connecting contacts and the transmission-device connecting contacts are connected to one another in an electrically conductive manner. This proviso substantially prevents the transmission device from being damaged while the method in accordance with the invention is being carried out so that, owing to the use of the method in accordance with the invention, there will be hardly any rejects of finished data carriers as a result of a transmission device which is damaged during the manufacture of a record carrier. Moreover, this yields the significant advantage that for carrying out the method in accordance with the invention it is possible to use machines and equipment with which it is also possible to carry out methods for manufacturing contact-bound data carriers, which is advantageous for manufacturing a data carrier in accordance with the invention for contactless uses at the lowest possible cost. For carrying out the method in accordance with the invention, in addition to the machines and equipment necessary to manufacture a contact-bound data carrier, the method in accordance with the invention only requires equipment needed to realize a transmission device required in data carrier for contactless uses. Thus, the method in accordance with the invention has the basic advantage that machines and equipment available at a manufacturer of data carriers for the production of data carriers for contact-bound uses can also be utilized for the production of data carriers for contactless uses.

In a method in accordance with the invention it has proved to be particularly advantageous if for the component to be mounted in the recess of the card body a component is used which forms part of a module for the contactless uses, which module comprises a plate-shaped component carrier and the component carried by this component carrier and the module connecting contacts which have been electrically connected to the component connecting contacts, and the module for the contactless uses is mounted in the recess, and the module connecting contacts of the module are connected to the transmission-device connecting contacts in an electrically conductive manner. In this way, the component for contactless uses can be mounted in the recess of a card body using the module for contactless uses and thus in a manner substantially identical to the manner in which the component for contact-bound uses is mounted, so that mounting of the component for contactless uses with the aid of the module for contactless uses is effected by means of a device for mounting modules for contact-bound uses, which is advantageous for a low-cost production.

In a method in accordance with the invention as defined in the preceding paragraph it has proved to be very advantageous if for the module to be mounted in the recess of the card body a module is used having a plate-shaped component carrier which has a first carrier main surface and a second carrier main surface, which is substantially parallel to the first carrier main surface, and in which the module connecting contacts of the module have been connected to the component carrier in the area of the second carrier main surface, and this module is mounted in the recess with the second carrier main surface and the module connecting contacts facing forward, and each module connecting contact of the module is connected in an electrically conductive manner to a transmission-device connecting contact disposed opposite said module connecting contact in a direction transverse to the second carrier main surface. This is advantageous for a method which can be implemented in the simplest possible way.

In a method utilizing a module comprising a component carrier having a first carrier main surface and a second carrier main surface, it has proved to be very advantageous if the module to be mounted in the recess of the card body is a module in which the module connecting contacts of the module project from the second carrier main surface of the component carrier, and in a bottom area of the recess, which area is remote from said body main surface, two passages are formed which extend from the recess to the transmission-device connecting contacts, and when the module is mounted in the recess the projecting module connecting contacts are connected to the transmission-device connecting contacts in an electrically conductive manner through the passages. Thus, it is achieved that when such a method is carried out automatically an electrical connection is established between the module connecting contacts and the transmission-device connecting contacts.

In a method in accordance with the invention as defined in the preceding paragraph, in which a recess as well as passages to the transmission-device connecting contacts are formed by material removal, it has proved to be particularly advantageous if the material removal for the formation of the recess and the passages to the transmission-device connecting contacts is effected by means of a milling operation. In this way a comparatively large volume of material can be removed very rapidly and very precisely, enabling tolerances of only a few micrometers to be maintained. Moreover, such a method is comparatively cheap because the expense required for the formation of the passages is only minimal.

In a method in accordance with the invention, in which a recess and passages from the recess to the transmission-device connecting contacts are formed in a manufactured card body, it has further proved to be particularly advantageous if before the module is mounted in the recess a test device for testing whether the transmission device is in good working order is operationally connected to the transmission-device connecting contacts via the recess and the passages. This has the advantage that during production of a data carrier the transmission-device connecting contacts can be made accessible from the exterior through the recess and the passages, so that an electrically conductive connection can be established between a test device and the coil connecting contacts to test whether a transmission device incorporated and embedded in a card body is in good working order. The module, which is expensive in comparison with the other data carrier parts, is not mounted in the card body until a positive test result has been obtained. Conversely, in the case of a negative test result, the card body including the defective coil embedded therein but without a module is rejected, so that no module is wasted unnecessarily, which is very advantageous in view of a low-cost production of a data carrier.

For a trouble-free formation of conductive connections between the module connecting contacts and the transmission-device connecting contacts it has proved to be advantageous if before the module is mounted in the recess an electrically conductive adhesive is introduced into the passages. In this way, particularly satisfactory and reliable aging-proof conductive connections are formed between the module connecting contacts and the transmission-device connecting contacts.

In a method in accordance with the invention, which utilizes a module comprising a plate-shaped component carrier having a first carrier main surface and a second carrier main surface, it has also proved to be very advantageous if the module to be mounted in the recess of the card body is a module in which the module connecting contacts are essentially disposed in the level zone of the second carrier main surface, and a stepped recess is formed in the manufactured card body by material removal, which recess terminates in said body main surface and has a cross-sectionally larger first recess portion, which adjoins said carrier main surface and is bounded by an annular bounding surface substantially parallel to said body main surface, and a cross-sectionally smaller second recess portion, which adjoins the first recess portion at the side which is remote from said body main surface, and channels are formed in the manufactured card body by material removal, which channels each extend from the annular bounding surface of the first recess portion up to a transmission-device connecting contact through the card body, and when the module is mounted in the recess each module connecting contact connected to the component carrier of the module is connected in an electrically conductive manner to a transmission-device connecting contact disposed opposite said module connecting contact by means of an electrically conductive connecting means previously introduced into a channel. Such a method has the advantage that it allows the use of module of a customary type, particularly with regard to the construction of the module connecting contacts.

In a method in which the recess as well as the channels to the transmission-device connecting contacts are formed by material removal, it has proved to be particularly advantageous if the material removal for the formation of the recess and the channels is effected by means of a milling operation. In this way a comparatively large volume of material can be removed very rapidly and very precisely, enabling tolerances of only a few micrometers to be maintained.

In a method in which a recess as well as channels to the transmission-device connecting contacts are formed by material removal, it has also proved to be particularly advantageous if before the module is mounted in the recess a test device for testing whether the transmission device is in good working order is operationally connected to the transmission-device connecting contacts via the channels. In this way, this method also has the afore-mentioned advantages obtained as a result of the possibility of testing a transmission device embedded in a card body.

In a method in accordance with the invention, in which a recess and passages from the recess to the transmission-device connecting contacts are formed in a card body, it has further proved to be particularly advantageous if before the module is mounted in the recess an electrically conductive adhesive is introduced into each channel as the electrically conductive connecting means. In this way, it is achieved that the electrically conductive connecting means serve not only for the electrically conductive connection but also for mechanically securing a module to the card body of a data carrier because the electrically conductive adhesive forms a proper and stable adhesive joint with the module connecting contacts and thus firmly secures the module to the card body.

In a method which utilizes a module comprising a plate-shaped component carrier having a first carrier main surface and a second carrier main surface, it has further proved to be very advantageous if before the module is mounted in the recess a hot-melt adhesive is applied in a peripheral area of the second carrier main surface of the component carrier of the module and after the module has been mounted in the recess a heating die of a heating device is placed onto the first carrier main surface of the carrier of the module to activate the hot-melt adhesive. This is advantageous for securing the module to the card body by means of its component carrier in a simple and reliable manner.

In all the methods defined hereinbefore a transmission device which operates capacitively can be provided.

However, it has proved to be particularly advantageous if as transmission device a coil is formed. Such a coil can be manufactured simply using proven techniques.

In a method in accordance with the invention as defined in the preceding paragraph it has proved to be particularly advantageous if the coil turns and the coil connecting contacts provided as transmission-device connecting contacts are formed on a carrier foil and subsequently the carrier foil, with the coil turns and the coil connecting contacts of the coil formed on said foil, is stacked with at least one further foil, the coil turns and the coil connecting contacts of the coil then being interposed between the carrier foil and a cover foil, and subsequently the stacked foils are laminated by means of a lamination process in order to form the card body. Thus, it is achieved that the advantages known from a customary and convectional lamination technique are also utilized in a method in accordance with the invention.

In the context given above it has further proved to be particularly advantageous if a polycarbonate foil is used as the carrier foil on which the coil turns and the coil connecting contacts of the coil are formed. In practice, such a polycarbonate foil has proved to be particularly advantageous because in the lamination process the coil together with its coil connecting contacts is uniformly pressed into such a foil and, as a result, the coil together with its coil connecting contacts is embedded in the finished data carrier body substantially without any mechanical loads and stresses.

In this respect, it has further proved to be very advantageous if a polyvinyl chloride foil is used as the cover foil which directly adjoins the coil turns and the coil connecting contacts of the coil during stacking of the foils. When such a polyvinyl chloride foil is used as a cover foil this enhances the uniform pressing-in and embedding of the coil.

In this respect, it has also proved to be very advantageous if the coil turns and the coil connecting contacts of the coil are formed by depositing a conductive material on the carrier foil in a screen-printing process. In this way, the advantages of screen-printing processes, whose use for the fabrication of coils for data carriers is known per se, are also utilized advantageously in a method in accordance with the invention.

In the context given above it has further proved to be very advantageous if the coil turns and the coil connecting contacts of the coil are formed by depositing a conductive silver paste on the carrier foil in a screen-printing process. This proves to be particularly advantageous in practice.

According to the invention a module of the type defined in the third paragraph is characterized in that the module connecting contacts adapted to cooperate with transmission-device connecting contacts project beyond the level of the component in a direction perpendicular to and away from the second carrier main surface. Such a module constructed in accordance with the invention can be used advantageously in a data carrier in accordance with the invention having a recess in its card body and having passages giving access to the transmission-device connecting contacts at the location of the bottom area of the recess, and in a method in accordance with the invention for manufacturing such a data carrier in accordance with the invention.

The above-mentioned aspects as well as further aspects of the invention will become apparent from the embodiments described hereinafter by way of examples and will be elucidated by means of these embodiments.

BRIEF DESCRIPTION OF THE DRAWINGS

The invention will now be described in more detail with reference to the drawings, which show seven embodiments to which the invention is not limited.

DETAILED DESCRIPTION OF THE PREFERRED EMBODIMENTS

First of all, a possible variant of a method in accordance with the invention for manufacturing a data carrier in accordance with the invention, in the form of a chip card for contactless uses, will be described hereinafter with reference to FIGS. 1 to 8.

Figure 1:
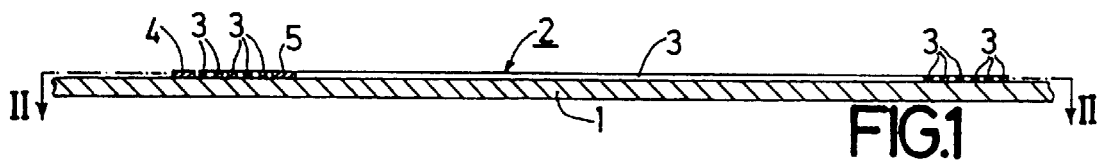
FIG. 1 is a cross-sectional view taken on the line I—I in FIG. 2 and showing a part of a large-area carrier foil which carries a multiplicity of coils, of which only one coil with its coil turns and coil connecting contacts is shown.

In a first process step a large-area carrier foil 1 shown in FIG. 1 is supplied to a screen-printing device. The carrier foil 1 has an area measuring 530 mm×660 mm. The thickness of the carrier foil 1 is approximately 125 $\mu$m. The carrier foil 1 is made of polycarbonate, which has proved to be very advantageous in the method described herein.

Figure 2:
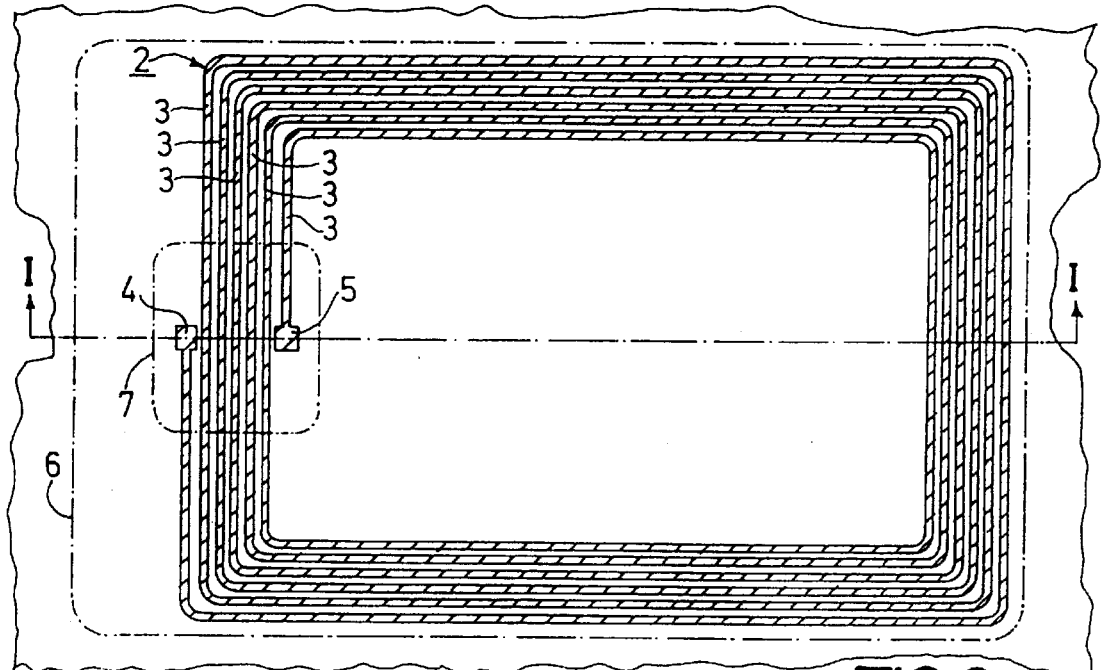
FIG. 2 is a sectional view taken on the line II—II in FIG. 1 and showing a coil with its coil turns and its two coil connecting contacts arranged on the large-area carrier foil.

In a subsequent process step a multiplicity of coils 2, which serve as transmission devices for contactless uses, are formed in the screen-printing device by means of a screen-printing technique in that a conductive material, in the present case a conductive silver paste, is applied to the carrier foil 1, which coils in the present case have a total of six coil turns 3 formed by conductor tracks. It is to be noted that the number and the shape of the coil turns 3 of the coils 2 may also differ. In the present case forty-eight coils are formed on the large-area carrier foil 1 at the same time, of which only one coil 2 is shown in FIGS. 1 and 2. The free end of the outermost coil turn and the free end of the innermost coil turn of each coil 2 has been provided with a rectangular coil connecting contact 4 and 5, respectively, which each form a transmission-device connecting contact. The two coil connecting contacts 4 and 5 are likewise constituted by conductor tracks, which are formed on the carrier foil 1 similarly to the coil turns 3. The thickness of the coil turns 3 and of the coil connecting contacts 4 and 5 of the coil 2 is approximately 25 $\mu$m. In order to obtain this thickness by means of a conventional screen-printing technique it is also possible to carry out a plurality of printing cycles, in each of which subsequent printing cycle conductive silver paste is deposited on the conductive silver paste applied in the preceding printing cycle, so that the desired thickness of the coil turns 3 and the two coil connecting contacts 4 and 5 of the coil 3 can be obtained by successively depositing layers of conductive silver paste onto one another in a screen-printing process.

The above formation of the coils 2 on the carrier foil 1 yields the intermediate product shown in FIGS. 1 and 2.

With respect to FIG. 2, it is to be noted that in this Figure the outline of a chip card to be manufactured is shown by means of a dash-dot line 6 and the outline of a carrier of a module including a component in the form of a chip is shown by means of a further dash-dot line 7.

Figure 3:
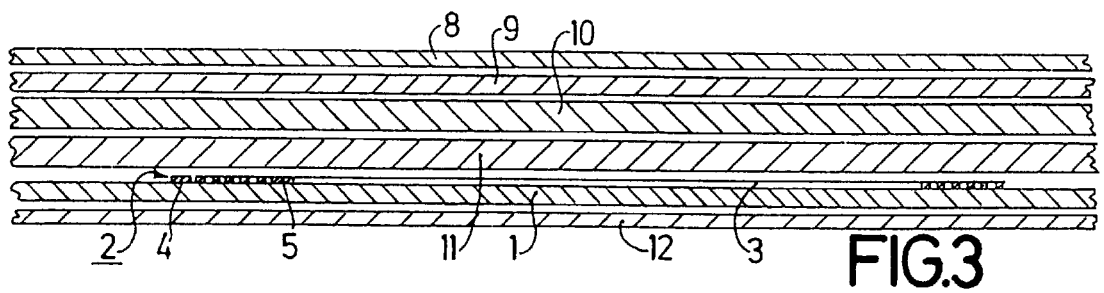
FIG. 3, in a manner similar to FIG. 1, shows a foil stack comprising a total of six large-area foils and including the large-area carrier foil as shown in FIG. 1.

In a subsequent process step—as is shown diagrammatically in FIG. 3—the large-area carrier foil 1 with the coils 2 formed on it is stacked together with, in the present case, five further foils 8, 9, 10, 11 and 12 in total, the coils 2 and, consequently, its coil connecting contacts 4 and 5 thus being interposed between the carrier foil 1 and a cover foil 11. With respect to the cover foil 11 it is to be noted that this is a polyvinyl chloride foil having a thickness of approximately 200 $\mu$m. The nominal areas of the further foils 8, 9, 10, 11 and 12 correspond to the area of the carrier foil 1.

As regards the foil 12 situated at that side of the surface of the carrier foil 1 which is remote from the coils 2, it is to be noted that this is also a polyvinyl chloride foil but that it has a thickness of only approximately 100 $\mu$m. Similarly to the foil 12, the foil 8 is also made of polyvinyl chloride and, similarly to the foil 12, it also has a thickness of approximately 100 $\mu$m. Similarly to the carrier foil 1, the foil 9 is also made of polycarbonate and, similarly to the foil 1, it also has a thickness of approximately 125 $\mu$m. Similarly to the foil 11, the foil 10 is also made of polyvinyl chloride and, similarly to the foil 11, it also has a thickness of approximately 200 $\mu$m.

Figure 4:
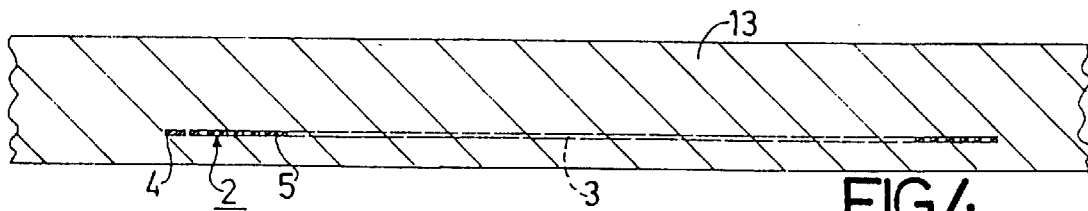
FIG. 4, in a manner similar to FIGS. 1 and 3, shows a large-area foil body obtained by lamination of the foil stack shown in FIG. 3, in which foil body a multiplicity of coils including their coil connecting contacts have been embedded.

After the foils 8, 9, 10, 11, 1 and 12 have been stacked, as can be see in FIG. 3, the stacked foils are laminated in a lamination process during a subsequent process step. In this lamination process the foils 8, 9, 10, 11, 1 and 12 are bonded to one another under the influence of pressure and heat, the individual foils being fused to one another in a controlled manner by a so-called foil homogenization, yielding a large-area foil body 13, as is shown in FIG. 4. In the large-area foil body 13, whose area measures 530 mm×660 mm, a plurality of coils 2 have been embedded, as is shown for a coil 2 in FIG. 4.

Figure 5:
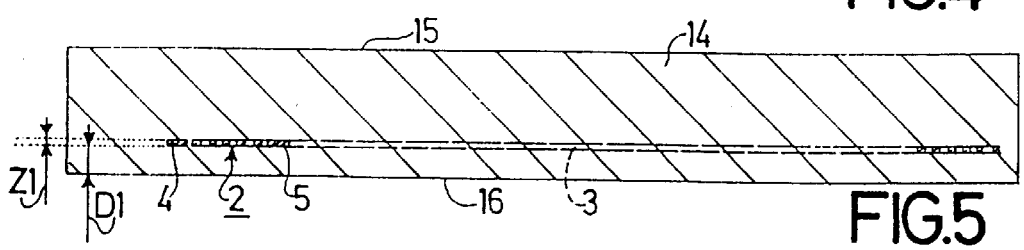
FIG. 5, in a manner similar to FIGS. 1, 3 and 4, shows a card body of a chip card punched out of the foil body shown in FIG. 4, in which card body a coil together with its two coil connecting contacts has been embedded.

In a subsequent process step a plurality of card bodies 14, to be regarded as data carrier bodies, are punched out of the large-area foil body 13 by means of a punching die in a punching operation. In the present case forty-eight card bodies 14 in total are punched from one foil body, of which one card body is shown in FIG. 5. The card body 14 shown in FIG. 5 is punched out of the large-area foil body 13 along the dash-dot line referenced 6 in FIG. 2.

The card body 14 is bounded by a first body main surface 15 and by a second body main surface 16 parallel to the first body main surface 15. The coil 2 is embedded in the card body 14, the coil turns 3 of the coil 2 as well as the two coil connecting contacts 4 and 5 of the coil 2 in the present case being incorporated in the card body 14 so as to extend parallel to the two body main surfaces 15 and 16 and being disposed in a winding level zone Z1 of the card body 14, which winding level zone extends transversely, in the present case perpendicularly, to the first body main surface 15 and, in the present case, also to the second body main surface 16. In the present case, the winding level zone Z1 in which the coil 2 is disposed is spaced at a distance D1 from the second body main surface 16. The distance D1 has a value of approximately 200 $\mu$m.

It is to be noted that the card body 14 for the chip card to be manufactured has a shape and dimensions corresponding to the shape and dimensions of card-shaped data carrier for contact-bound uses in accordance with the standard ISO 7810. Moreover, it is to be noted that the coil connecting contacts 4 and 5 are arranged in the card body 14 at a position corresponding to the position of a contact surface, which consists of contacts, on a card-shaped data carrier for contact-bound uses in accordance with the standard ISO 7816-2.

Figure 6:
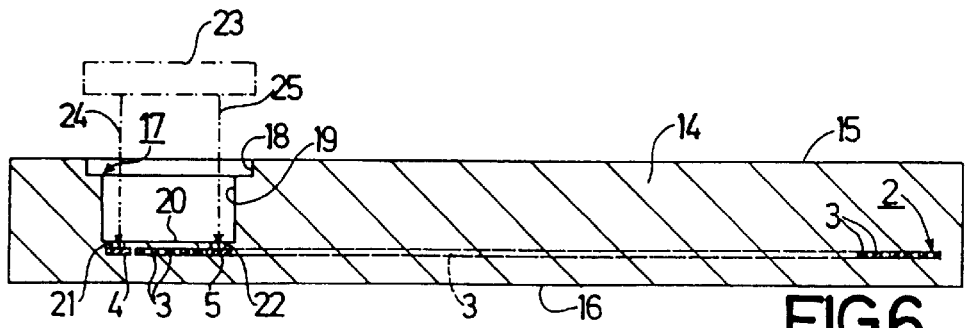
FIG. 6, in a manner similar to FIGS. 1, 3, 4 and 5, shows the card body of FIG. 5, which has a recess and two passages which extend from the recesses up to the two coil connecting contacts.

In a subsequent process step a recess 17, as can be seen in FIG. 6, is formed in the manufactured card body 14 by removing material by means of a milling cutter in a milling operation. During said milling operation two milling steps are carried out, as a result of which a recess 17 is formed having a cross-sectionally larger first recess portion 18 and a cross-sectionally smaller second recess portion 19. The recess 17—as is apparent from FIG. 6—terminates in the first body main surface 15. It is to be noted that the recess 17 is situated in the card body 14 at a position corresponding to the position of a contact surface, which consists of contacts, on a card-shaped data carrier for contact-bound uses in accordance with the standard ISO 7816-2.

In a bottom area which is remote from the first body main surface 15, i.e. in the area of a bottom surface 20 of the recess 17, two passages 21 and 22 are formed which extend from the recess 17 to the coil connecting contacts 4 and 5. The two passages 21 and 22 are formed in a third milling step and in a fourth milling step of said milling operation.

In a following process step a test device 23, shown diagrammatically by means of a dash-dot line in FIG. 6, for testing whether the coil 2 is in good working order, is brought into operational contact with the two coil connecting contacts 4 and 5 of the coil 2 via the recess 17 and the two passages 21 and 22. This is effected in that two test contacts 24 and 25 of the test device 23 are brought into conductive contact with the two coil connecting contacts 4 and 5, said test contacts being shown diagrammatically as dash-dot arrows in FIG. 6. By means of the test device 23 it is possible to determine whether the coil 2 is in good working order. When the test device 25 detects a defective or faulty coil 2 the relevant card body 14 together with the defective coil 2 embedded therein is rejected. When by means of the test device 23 a positive test result is obtained, indicating that the coil 2 is in good working order, the relevant card body 14 together with the coil 2 embedded therein is subsequently used for the fabrication of a chip card.

Figure 7:
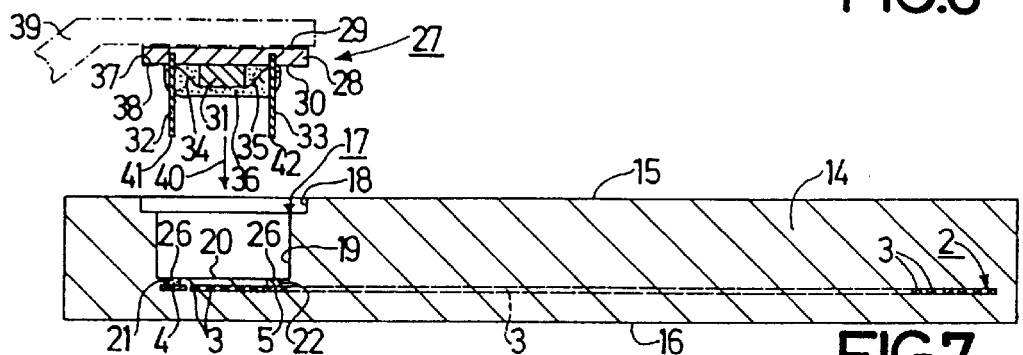
FIG. 7, in a manner similar to FIGS. 1, 3, 4, 5 and 6, shows the card body of FIG. 6, in which an electrically conductive adhesive has been introduced into the passages and a module is situated above the recess in the card body.

In a further process step an electrically conductive adhesive 26 is introduced into the two channels 21 and 22 by means of a dispenser device, as is shown in FIG. 7.

Already before the electrically conductive adhesive 26 is introduced into the two passages 21 and 22 a so-called module is processed in the method described here. Such a module 27, exclusively for contactless uses, is shown diagrammatically in FIG. 7.

The module 27 comprises a plate-shaped carrier 28, hereinafter briefly referred to as carrier 28. The carrier 28 is bounded by a first carrier main surface 29 and by a second carrier main surface 30, which extends parallel to the first carrier main surface 29. The dimensions of the surface area of the carrier 28 substantially correspond to the cross-sectional dimensions of the first recess portion 18, i.e. they are only slightly smaller. The outlines of the first recess portion 18 and of the carrier 28 are as represented by means of the dash-dot line 7 in FIG. 2. These outlines indicated by the line 7 correspond to the outlines of a contact surface, consisting of contacts, on a card-shaped data carrier for contact-bound uses in accordance with the standard ISO 7816-2.

The module 27 further comprises a component in the form of a chip 31 exclusively for contactless uses, which in known manner is formed by an integrated device. The chip 31 is attached to the carrier 28, i.e. to the second carrier main surface 30 of the carrier 28, for example by means of an adhesive joint. As is apparent from FIG. 7, the chip 31 is thus raised with respect to the second carrier main surface 30.

The module 27 further comprises two module connecting contacts 32 and 33 situated in the area of the second carrier main surface 30 and adapted to cooperate with the two coil connecting contacts 4 and 5. The two module connecting contacts 32 and 33 are pin-shaped and are connected to the carrier 28, from whose second carrier main surface 30 the two pin-shaped module connecting contacts 32 and 33 project perpendicularly in the present case. The two module connecting contacts 32 and 33—which is shown only diagrammatically in FIG. 7—are each connected in an electrically conductive manner to chip connecting contacts of the chip 31 via a so-termed bonding wire 34 or 35, which connecting contacts are not shown in FIG. 7 and are generally referred to as pads among experts. In reality the pin-shaped module connecting contacts 32 and 33 are electrically connected to two conductor tracks, not shown, which are arranged on the carrier 28 in the area of the second carrier main surface 30 of the carrier 28, each of the two bonding wires 34 and 35 being electrically connected to one of these two conductor tracks.

It is to be noted that the chip 31 and the two bonding wires 34 and 35 as well as part of the two module connecting contacts 32 and 33 are embedded in a package 36 formed by a synthetic-resin encapsulant.

As is apparent from FIG. 7, the two module connecting contacts 32 and 33 in the present module 27 are of a special construction, i.e. such that the module connecting contacts 32 and 33 adapted to cooperate with the two coil connecting contacts 4 and 5 extend beyond the level of the chip 31 and, in the present case also the package 36, in a direction perpendicular to and away from the second carrier main surface 30.

A module 27 as described hereinbefore is supplied in large quantities by, for example, a manufacturer of such modules, said modules being supplied, for example, in tape form.

In the course of the process described here a hot-melt adhesive 38 is applied in a peripheral area 37 of the second carrier main surface 30 of the carrier 28 during a further process step, as is indicated in FIG. 7.

Figure 8:
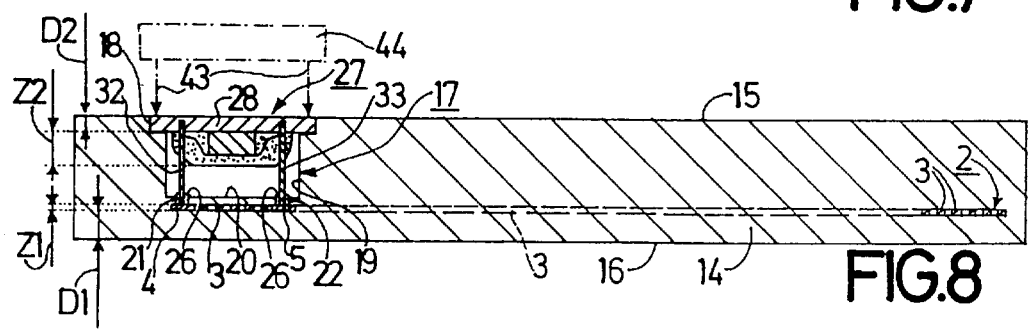
FIG. 8, in a manner similar to FIGS. 1, 3, 4, 5, 6 and 7, shows a finished chip card as a data carrier in accordance with a first embodiment of the invention, a module being accommodated in the recess of its card body.
Figure 9:
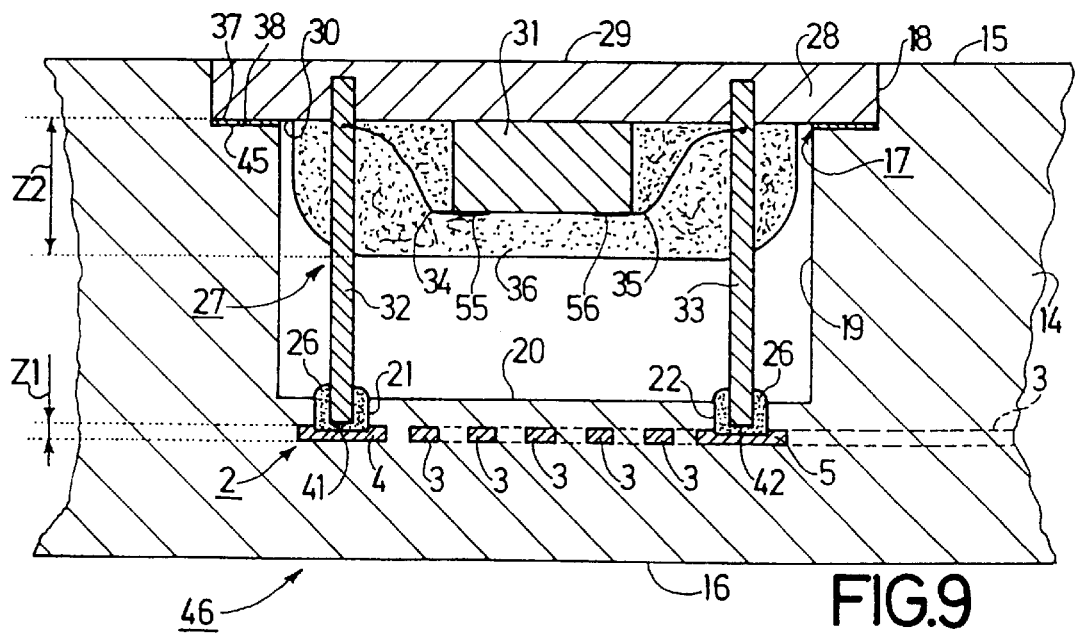
FIG. 9, in a manner similar to FIG. 8, shows the finished chip card with the module mounted in the recess, the card being shown only partly and to a scale four times as large as that of FIG. 8, the two module connecting contacts and the two coil connecting contacts being connected to one another in an electrically conductive manner by means of an electrically conductive adhesive.

Subsequently, in a further process step the module 27 is placed in the recess 17 by means of a bonding arm 39, shown diagrammatically in dash-dot lines in FIG. 7, with the chip 31 and the two module connecting contacts 32 and 33 facing forward in the direction indicated by the arrow 40. Towards the end of this placement operation the free end portions 41 and 42 of the two pin-shaped module connecting contacts 32 and 33 engage the two passages 21 and 22 filled with the electrically conductive adhesive 26. Depending on the prevailing tolerances the free ends 41 and 42 of the two module connecting contacts 32 and 33 may even penetrate so far that they directly adjoin the two coil connecting contacts 4 and 5. However, as a rule a small clearance will remain between the free ends 41 and 42 of the module connecting contacts 32 and 33 and the coil connecting contacts 4 and 5, as is shown in FIG. 9. When the free end portions 41 and 42 of the module connecting contacts 32 and 33 penetrate the passages 21 and 22 the electrically conductive adhesive 26 is partly urged out of the passages 21 and 22, as is shown in FIGS. 8 and 9. After the module 27 has been placed into the recess 17 of the card body 14 the process situation illustrated in FIG. 8 is obtained. The edges of the plate-shaped carrier 28 of the module 27 are then enclosed by the recess 17 and the carrier 28 covers the chip 31 carried by it and the module connecting contacts 32 and 33 of the module 27.

In a further process step a heating die 43, represented diagrammatically by means of two arrows in FIG. 8, which die forms part of a heating device 44, represented diagrammatically in dash-dot lines in FIG. 8, is placed onto the first carrier main surface 29 of the carrier 28 in order to activate the hot-melt adhesive 38. Subsequently, heat is transferred from the applied heating die 43 to the hot-melt adhesive via the carrier 28, after which the heating die 43 is lifted off the carrier 43. During the subsequent cooling an adhesive joint is formed between the peripheral area 37 of the carrier 28 and the annular bounding surface 45 of the recess 17, which surface extends parallel to the two body main surfaces 15 and 16, said adhesive joint thus securing the module 27 to the card body 14. To secure the module 27 to the card body 14 it is also possible to use an adhesive as employed in the so-called cold bonding technique.

Upon completion of the last-mentioned process step a finished chip card 46 forming a data carrier in accordance with a first embodiment of the invention is obtained. This chip card 46 is shown partly in FIG. 9.

Upon mounting of the module 27 in the recess 17 of the card body 14 the first carrier main surface 29 of the carrier 28 lies against the first body main surface 15 of the card body 14 and, in the present case, the first carrier main surface 29 is then flush with the first body main surface 15. Furthermore, the second carrier main surface 30 of the carrier 28 is then remote from the first body main surface 15 of the card body 14 and faces the second body main surface 16 of the card body 14. Moreover, the chip 31 forming the component is then situated in a component level zone Z2 of the card body 14, which component level zone extends transversely, in the present case perpendicularly, to the first body main surface 15 and, in the present case, also perpendicularly to the second body main surface 16 of the card body 14. In this case the component level zone Z2 is spaced at a distance D2 from the first body main surface 15. The distance D2 now has a value of approximately 100 μm. In the present case, in which the chip 31 is embedded in a package 36, the component level zone Z2 of the card body 14 extends over the entire height dimension of the package 36. In the case that a module is used in which the chip forming the component does not have a package, or in which the package is substantially flush with the chip, it is adequate if the component level zone Z2 extends only up to the end level zone of the chip, which area is remote from the second carrier main surface of the carrier.

As is apparent from FIG. 9, the data carrier 46 has advantageously been constructed in such a manner that the coil turns 3 of the coil 2 and, in the present case also the two coil connecting contacts 4 and 5 of the coil 2, are disposed in a winding level zone Z1 situated outside the component level zone Z2 and that the two module connecting contacts 32 and 33 extend up to the two coil connecting contacts 4 and 5 through the component level zone Z2 and, in the present case, also beyond the component level zone Z2. This construction has the advantage that—although the chip 31 and its package 36 project from the same carrier main surface, i.e. the second carrier main surface 30 of the carrier 28 of the module 27—the presence of the chip 31 does not impose any restrictions on the arrangement of the coil turns 3 of the coil 2 and the construction of the coil 2 in the proximity of the chip 31 forming the component because the chip 31 together with its package 36 is disposed spaced from the recess bottom surface 20 and in a completely other level zone than the coil turns 3 of the coil 2 and the two coil connecting contacts 4 and 5 of the coil 2. As is also apparent from FIG. 9, the fact that the two module connecting contacts 32 and 33 extend up to the two coil connecting contacts 4 and 5 does not mean that the module connecting contacts 32 and 33 and the coil connecting contacts 4 and 5 are directly in contact with one another. In the data carrier 46, as is shown in FIG. 9, the mechanical connection between the module connecting contacts 32, 33 and the coil connecting contacts 4, 5 as well as the electrical connection between these contacts are made by means of the electrically conductive adhesive 26, which guarantees a reliable and aging-proof connection between the module connecting contacts 32, 33 and the coil connecting contacts 4, 5. As is also apparent from FIG. 9, the two coil connecting contacts 4 and 5 have been slightly milled off during milling of the two passages 21 and 22, but this does not give rise to any adverse effects. The two coil connecting contacts 4 and 5 may even be perforated completely during the milling operation without any undesired effect on the electrically conductive connection between the module connecting contacts 32, 33 and the coil connecting contacts 4, 5, because the electrically conductive adhesive 26 completely fills up the perforations in the two coil connecting contacts 4 and 5 and thereby also establishes a proper electrical connection between the module connecting contacts 32, 33 and the coil connecting contacts 4, 5. It is to be noted that FIG. 9 also shows the chip connecting contacts (pads) referred to as component connecting contacts of the chip forming the component. The chip connecting contacts bear the reference numerals 55 and 56.

As has been mentioned in the preceding description of the method of manufacturing a data carrier in accordance with the invention exclusively for contactless uses, i.e. the chip card 46, this method begins with the incorporation of a coil 2 in a card body 14, which is effected in a lamination process, after which a recess 17 is formed in the manufactured card body 14 by material removal in a milling operation, which recess terminates in the first body main surface 15 and is situated at a position corresponding to the position of a contact surface, which consists of contacts, on a card-shaped data carrier for contact-bound uses in accordance with the standard ISO 7816-2, after which finally a module 27 exclusively for contactless uses, which module includes a chip 31 exclusively for contactless uses, is placed in the recess 17 and an electrically conductive connection of the module connecting contacts 32 and 33 with the coil connecting contacts 4 and 5 of the coil 2 is made, which coil connecting contacts occupy a position in the card body 14, which corresponds to the position of a contact surface, which consists of contacts, on a card-shaped data carrier for contact-bound uses in accordance with the standard ISO 7816-2. In this way, it is achieved that a chip card 46 forming a data carrier in accordance with the invention intended exclusively for contactless uses can be manufactured substantially without any rejects as a result of a defective coil, which is advantageous for a low-cost production of such a data carrier. A further advantage is that a data carrier in accordance with the invention intended exclusively for contactless uses, as described hereinbefore, can be manufactured using machines and equipment known for the production of card-shaped data carriers for contact-bound uses, so that said machines and equipment serve a double purpose, i.e. for the production of known card-shaped data carriers intended exclusively for contact-bound uses as well as for the production of card-shaped data carriers in accordance with the invention intended exclusively for contactless uses, the production of such a card-shaped data carrier in accordance with the invention intended exclusively for contactless uses, merely requiring additional equipment for the production of the coil of such a data carrier for contactless uses only.

Figure 10:
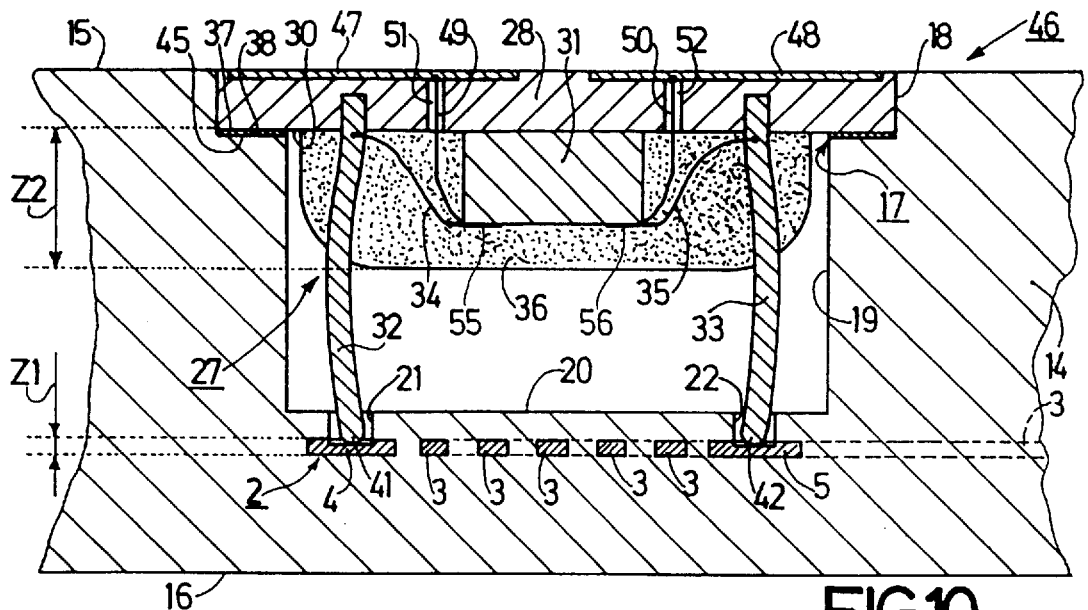
FIG. 10, in a manner similar to FIG. 9, shows a finished chip card as a data carrier in accordance with a second embodiment of the invention, which chip card also comprises a laminated card body and has two module connecting contacts which are elastically resilient and which are connected to one another in an electrically conductive manner exclusively by virtue of their elasticity.

FIG. 10 shows a chip card 46 forming a data carrier in accordance with a second embodiment of the invention exclusively for contactless uses. In this chip card 46 the module 27 has two elastically resilient module connecting contacts 32 and 33, whose nominal length has been selected in such a manner that in the finished condition of the data carrier 46 shown in FIG. 10 the two module connecting contacts 32 and 33 are bent by virtue of their elasticity and thus form an electrically conductive connection to the two coil connecting contacts 4 and 5 of the coil 2 exclusively by virtue of their elasticity, so that no electrically conductive adhesive for connecting the module connecting contacts 32, 33 and the coil connecting contacts 4, 5 is required and can thus be saved.

In the chip card 46 as shown in FIG. 10 further module connecting contacts arranged in the area of the first carrier main surface 29 are connected to the carrier 28 of the module 27 and are adapted to cooperate with mating contacts with which they are engageable from outside the chip card 46. The chip card 46 of FIG. 10 has eight of such further module connecting contacts in total, only two of said further module connecting contacts 47 and 48 being shown in FIG. 10. As is shown for the two further module connecting contacts 47 and 48 in FIG. 10, the further module connecting contacts are connected to further chip connecting contacts (pads), not shown, of the chip 31 via further bonding wires, two of said further bonding wires 49 and 50 being shown in FIG. 10. The further bonding wires are passed through bores formed in the carrier 28, two of said bores 51 and 52 being shown in FIG. 10.

The chip 31 forming the component of the chip card 46 in FIG. 10 is a so-termed dual-purpose chip whose module connecting contacts 32 and 33 arranged in the area of the second carrier main surface 30 are connected to the coil connecting contacts 4 and 5 of the coil 2 provided for the contactless data exchange between the dual-purpose chip and a write/read station and, optionally, for the contactless transmission of power to the dual-purpose chip, and whose further module connecting contacts arranged in the area of the first carrier main surface 29 are adapted to provide the contact-bound data exchange between the dual-purpose chip and a write/read station for the contact-bound transmission of power to the dual-purpose chip.

In the chip card 46 as shown in FIG. 10 the component formed by the chip 31 including its package 36 and the coil 2 with its coil turns 3 and its two coil connecting contacts 4 and 5 are disposed in different level zones, i.e. the component formed by the chip 31 including its package 36 is disposed in the component level zone Z2 and the coil 2 is disposed in the winding level zone Z1, which in the chip card 46 of FIG. 10 also yields the great advantage that—although the chip 31 and its package 36 and the two module connecting contacts 32 and 33 project from the same carrier main surface, i.e. the second carrier main surface 30 of the carrier 28 of the module 27—the presence of the chip 31 does not impose any restrictions on the arrangement of the coil turns 3 of the coil 2 and the construction of the coil 2 in the proximity of the chip 31.

Figure 11:
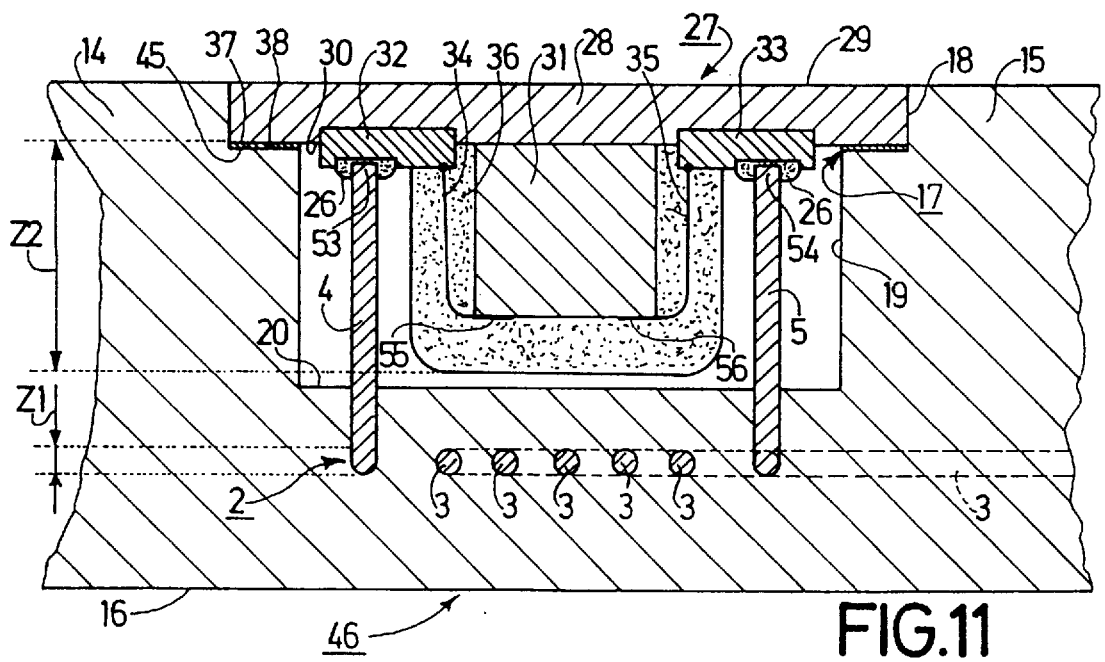
FIG. 11, in a manner similar to FIGS. 9 and 10, shows a finished chip card as a data carrier in accordance with a third embodiment of the invention, which chip card comprises an injection-molded card body and includes a coil whose coil turns consist of very thin coil wire and whose coil connecting contacts are formed by bent wire end portions.
Figure 12:
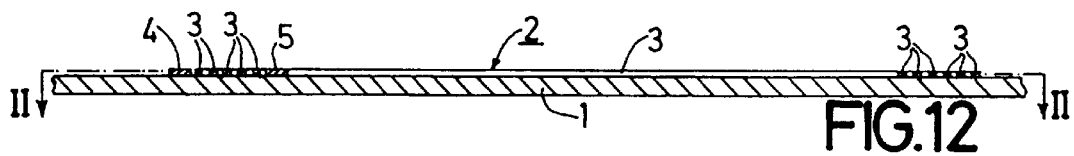
FIG. 12 is a cross-sectional view taken on the line XII—XII in FIG. 13 and showing a part of a large-area carrier foil carrying a plurality of coils, of which only one coil with its coil turns and its two coil connecting contacts is shown.
Figure 13:
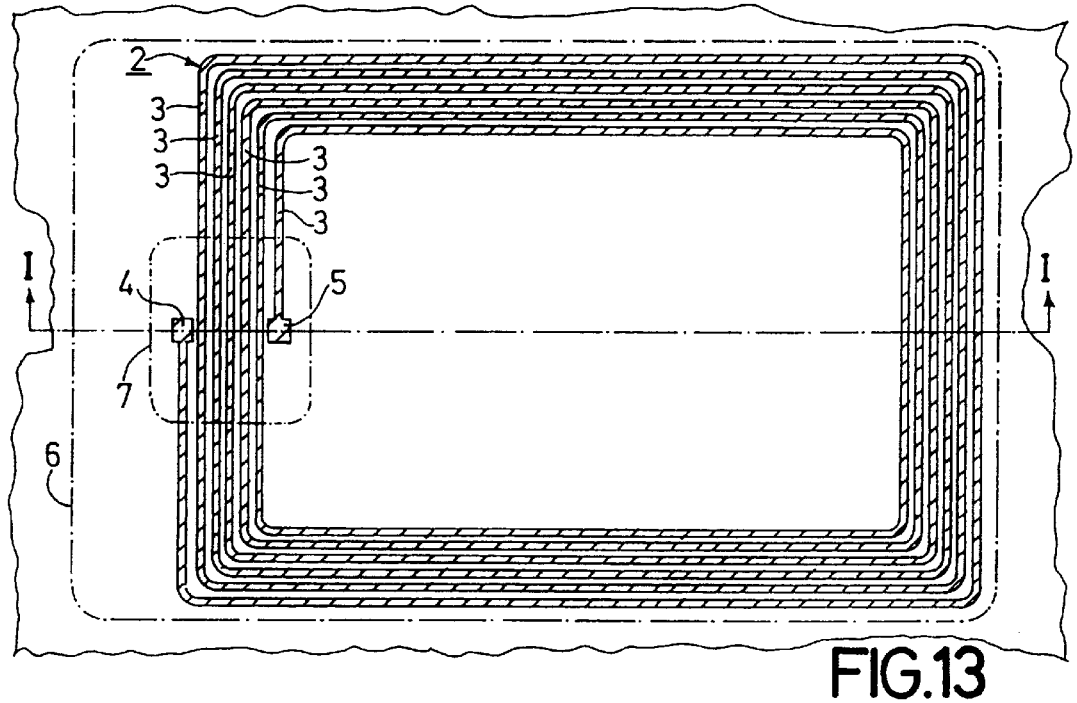
FIG. 13 is a cross-sectional view taken on the line XIII—XIII in FIG. 12 and showing a coil with its coil turns and its two coil connecting contacts on the large-area carrier foil.
Figure 14:
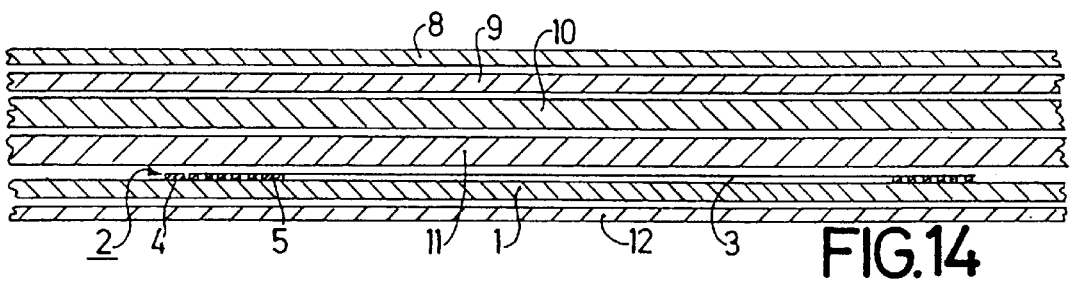
FIG. 14, in a manner similar to FIG. 12, shows a foil stack consisting of six large-area foils in total and including the large-area carrier foil as shown in FIG. 1.
Figure 15:
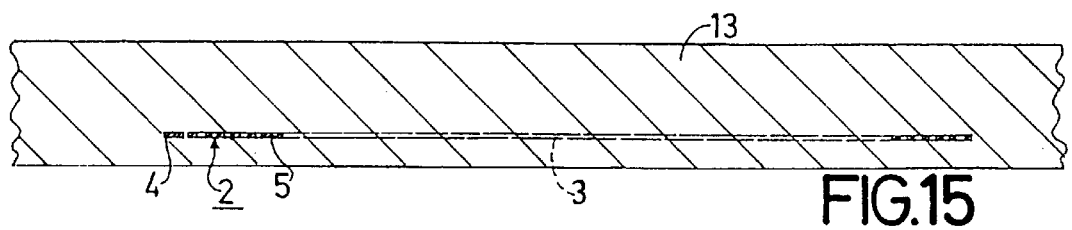
FIG. 15, in a manner similar to FIGS. 12 and 14, shows a large-area foil body obtained by lamination of the foil stack shown in FIG. 14 and in which a multiplicity of coils including their coil connecting contacts have been embedded.
Figure 16:
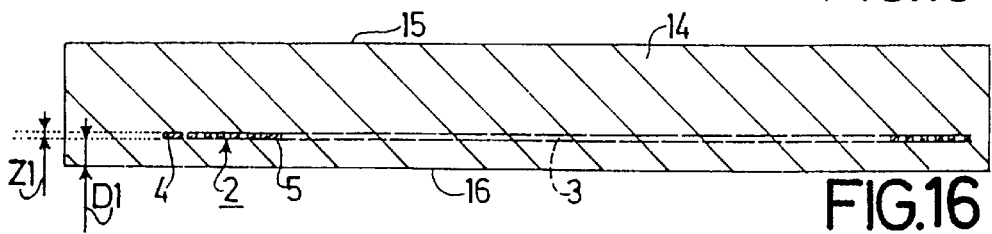
FIG. 16, in a manner similar to FIGS. 12, 14 and 15, shows a card body of a chip card punched out of the foil body shown in FIG. 15, in which card body a coil together with its two coil connecting contacts has been embedded.

FIG. 11 shows a chip card 46 forming a data carrier in accordance with a third embodiment of the invention exclusively for contactless uses. The chip card 46 as shown in FIG. 11 comprises as data card body a card body 14 manufactured in an injection-molding process. In the injection-molded card body a coil 2 is embedded whose coil turns 3 consist of a very thin coil wire. At the end of the outermost coil turn and at the end of the innermost coil turn these two coil turns have offset wire portions which extend substantially perpendicularly to the body main surfaces 15 and 16 and also to the carrier main surfaces 29 and 30 and which form the two coil connecting contacts 4 and 5 of the coil 2. In the chip card 46 as shown in FIG. 11 the two coil connecting contacts 4 and 5 are connected to the two module connecting contacts 32 and 33 by means of an electrically conductive adhesive 26 both mechanically and electrically. In the present case, the two module connecting contacts 32 and 33 are flat and slightly project from the second carrier main surface 30. With their free end portions 53 and 54 the two wire-shaped coil connecting contacts 4 and 5 are situated very close to the two flat module connecting contacts 32 and 33 and are connected to the last-mentioned contacts by means of the electrically conductive adhesive 26 both mechanically and electrically.

As is apparent from FIG. 11, the coil turns 3 of the coil 2 in the chip card 46 as shown in FIG. 11 are disposed in a winding level zone Z1 outside the component level zone Z2. However, in contradistinction to the two chip cards 46 shown in FIGS. 9 and 10, the two coil connecting contacts 4 and 5 formed by the offset wire portions in the chip card 46 shown in FIG. 11 extend over a part of the component level zone Z2 up to the two module connecting contacts 32 and 33, as a result of which their free ends 53 and 54 lie sufficiently close to the two module connecting contacts 32 and 33 to come into electrical contact with the two module connecting contacts 32 and 33 via the electrically conductive adhesive 26.

In the chip card 46 as shown in FIG. 11, although the chip 31 and its package 36 and the two module connecting contacts 32 and 33 project from the same carrier main surface, i.e. the second carrier main surface 30 of the carrier 28 of the module 27, the presence of the chip 31 neither imposes any restrictions on the arrangement of the coil turns 3 of the coil 2 and the construction of the coil 2. A further advantage of the chip card 46 as shown in FIG. 11 resides in the fact that this chip card 46 employs a conventional module 27 which does not have any module connecting contacts 32 and 33 which project beyond the level of the chip 31, as a result of which there is no risk of the module connecting contacts 32 and 33 being damaged during manipulation of the module 27.

In the chip card 46 as shown in FIG. 11 the coil turns 3 extend in the winding level zone Z1 over their whole area or extent. This need not necessarily be so because the coil turns 3 may also be disposed within the component level zone Z2 in their area which does not face and does not adjoin the chip 31 or the chip package 36, i.e. in a direction transverse to the body main surfaces 15 and 16, which can be achieved by a suitably bent or angled shape of the coil 2. In this respect it is essential that, at least in the area adjacent the chip 31 forming the component, the coil turns 3 of the coil 2 are disposed in a winding level zone Z1 outside the component level zone Z2.

The two chip cards 46 shown in FIGS. 10 and 11 are likewise constructed in such a manner that the recess 17 in the card body 14 is situated at a position in the chip card for contactless uses, which corresponds to the position of a contact surface, which consists of contacts, on a card-shaped data carrier for contact-bound uses in accordance with the standard ISO 7816-2, as a result of which a module 27 placed in this recess 17 occupies a corresponding position, the coil connecting contacts 4 and 5 in the card body 15 occupying a position which corresponds to the position of a contact surface, which consists of contacts, on a card-shaped data carrier for contact-bound uses in accordance with the standard ISO 7816-2. Consequently, the chip cards as shown in FIGS. 10 and 11 also have the advantages already mentioned with reference to the chip card 46 shown in FIG. 9.

A further variant of a method of manufacturing a card-shaped data carrier in accordance with the invention for contactless uses, constructed as a chip card, will be described hereinafter with reference to FIGS. 12 to 19.

In this method the first process steps illustrated in FIGS. 12 to 16 correspond to the process steps described with reference to FIGS. 1 to 5, for which reason these process steps will not be described again. It is to be noted only that the card body 14 for the chip card to be manufactured, which is intended for contactless uses, has a shape and dimensions corresponding to the shape and dimensions of a card body of a card-shaped data carrier for contact-bound uses in accordance with the standard IS 7810. Furthermore, it is to be noted that the coil connecting contacts 4 and 5 in the card body 14 occupy a position corresponding to the position of a contact surface, which consists of contacts, on a card-shaped data carrier for contact-bound uses in accordance with the standard ISO 7816-2.

Figure 17:
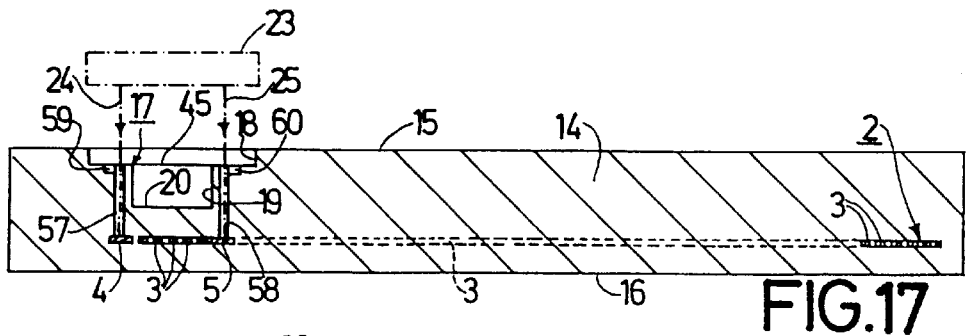
FIG. 17, in a manner similar to FIGS. 12, 14, 15 and 16, shows the card body of FIG. 16, which has a recess and two channels which extend from the recesses up to the two coil connecting contacts.

In a subsequent process step a stepped recess 17, as can be seen in FIG. 17, is formed in the manufactured card body 14 by removing material by means of a milling cutter in a milling operation. The recess 17 terminates in the first body main surface 15. During said milling operation two milling steps are carried out, as a result of which a recess 17 is formed having a cross-sectionally larger first recess portion 18, which adjoins the first body main surface 15 and which is bounded by, inter alia, an annular bounding surface 45 parallel to the first body main surface 15, and a cross-sectionally smaller second recess portion 19, which adjoins the first recess portion 18 at the side which is remote from the first body main surface 15 and which is bounded by, inter alia, the bottom surface 20. It is to be noted that the recess 17 is situated in the card body 14 at a position corresponding to the position of a contact surface, which consists of contacts, on a card-shaped data carrier for contact-bound uses in accordance with the standard ISO 7816-2.

Two channels 57 and 58 are made in the card body by material removal in a third milling step and in a fourth milling step of said milling operation, which channels each extend from the annular bounding surface 45 of the first recess portion 18 to a respective coil connecting contact 4 or 5 through the card body 14. The two channels 57 and 58 extend transversely to the first body main surface 15 and the second body main surface 16 of the card body 14, i.e. in the present case perpendicularly to the two body main surfaces 15 and 16, and are enclosed by the card body 14 over their whole length. Via their ends which are remote from the two coil connecting contacts 4 and 5 the two channels 57 and 58 are accessible from the exterior. At its end which is remote from the respective coil connecting contact 4 or 5 each channel 57 or 58 has a pocket 59 or 60, respectively, which extends in a lateral direction away from the respective channel 57 or 58.

In a following process step a test device 23, shown diagrammatically by means of a dash-dot line in FIG. 17, for testing whether the coil 2 is in good working order, is brought into operational contact with the two coil connecting contacts 4 and 5 of the coil 2 via the recess 17 and the two channels 57 and 58. This is effected in that two test contacts 24 and 25 of the test device 23 are brought into conductive contact with the two coil connecting contacts 4 and 5, said test contacts being shown diagrammatically as dash-dot arrows in FIG. 17. By means of the test device 23 it is possible to determine, in the same way as in the method described hereinbefore, whether the coil 2 is in good working order. When the test device 23 detects a defective or faulty coil 2 the relevant card body 14 together with the defective coil 2 embedded therein is rejected. When by means of the test device 23 a positive test result is obtained, indicating that the coil 2 is in good working order, the relevant card body 14 together with the coil 2 embedded therein is subsequently used for the fabrication of a chip card.

Figure 18:
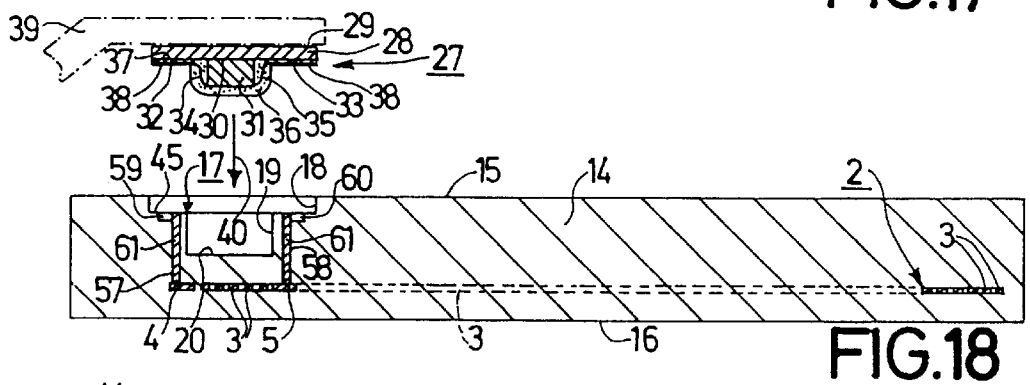
FIG. 18, in a manner similar to FIGS. 12, 14, 15, 16 and 17, shows the card body of FIG. 17, in which an electrically conductive adhesive has been introduced into the channels and a module is situated above the recess in the card body.

In a further process step an electrically conductive adhesive in introduced as an electrically conductive connecting means 61 into the two channels 57 and 58 by means of a dispenser device, as is shown in FIG. 18.

Already before the electrically conductive adhesive 61 is introduced into the two channels 57 and 58 a so-called module is processed in the method described here. Such a module 27, exclusively for contactless uses, is shown diagrammatically in FIG. 18.

The module 27 comprises a plate-shaped component carrier 28, hereinafter briefly referred to as carrier 28. The carrier 28 is bounded by a first carrier main surface 29 and by a second carrier main surface 30, which extends parallel to the first carrier main surface 29. The dimensions of the surface area of the carrier 28 substantially correspond to the cross-sectional dimensions of the first recess portion 18, i.e. they are only slightly smaller. The outlines of the first recess portion 18 and of the carrier 28 are as represented by means of the dash-dot line 7 in FIG. 13. These outlines indicated by the line 7 correspond to the outlines of a contact surface, consisting of contacts, on a card-shaped data carrier for contact-bound uses in accordance with the standard ISO 7816-2.

The module 27 further comprises a component in the form of a chip 31 exclusively for contactless uses, which in known manner is formed by an integrated device. The chip 31 is attached to the carrier 28, i.e. to the second carrier main surface 30 of the carrier 28, for example by means of an adhesive joint. As is apparent from FIG. 18, the chip 31 is thus raised with respect to the second carrier main surface 30.

The module 27 further comprises two module connecting contacts 32 and 33 situated in the area of the second carrier main surface 30 and adapted to cooperate with the two coil connecting contacts 4 and 5. The two module connecting contacts 32 and 33 are flat and are formed by conductor tracks provided on the carrier 28. The two module connecting contacts 32 and 33—which is shown only diagrammatically in FIG. 18—are each connected in an electrically conductive manner to chip connecting contacts of the chip 31 via a so-termed bonding wire 34 or 35, which connecting contacts are not shown in FIG. 18 and are generally referred to as pads among experts.

It is to be noted that the chip 31 and the two bonding wires 34 and 35 as well as part of the two module connecting contacts 32 and 33 are embedded in a package 36 formed by a synthetic-resin encapsulant.

A module 27 as described hereinbefore is supplied in large quantities by, for example, a manufacturer of such modules, said modules being supplied, for example, in tape form.

In the course of the process described here a hot-melt adhesive 38 is applied in a peripheral area 37 of the second carrier main surface 30 of the carrier 28 during a further process step, as is indicated in FIG. 18.

Figure 19:
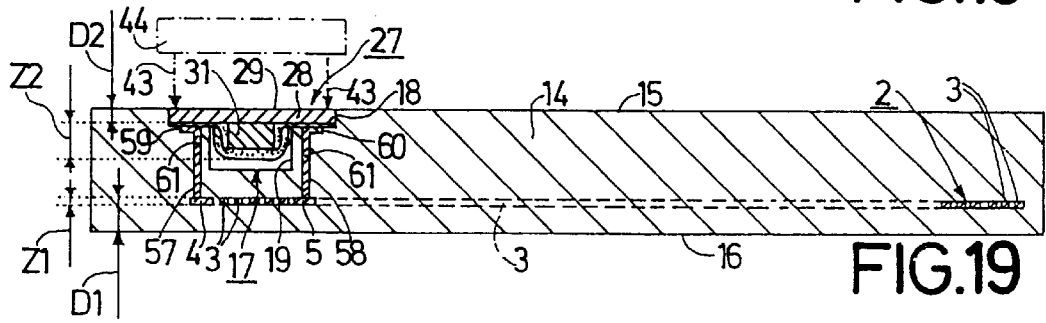
FIG. 19, in a manner similar to FIGS. 12, 14, 15, 16, 17 and 18, shows a finished chip card as a data carrier in accordance with a first embodiment of the invention, a module being accommodated in the recess of its card body.
Figure 20:
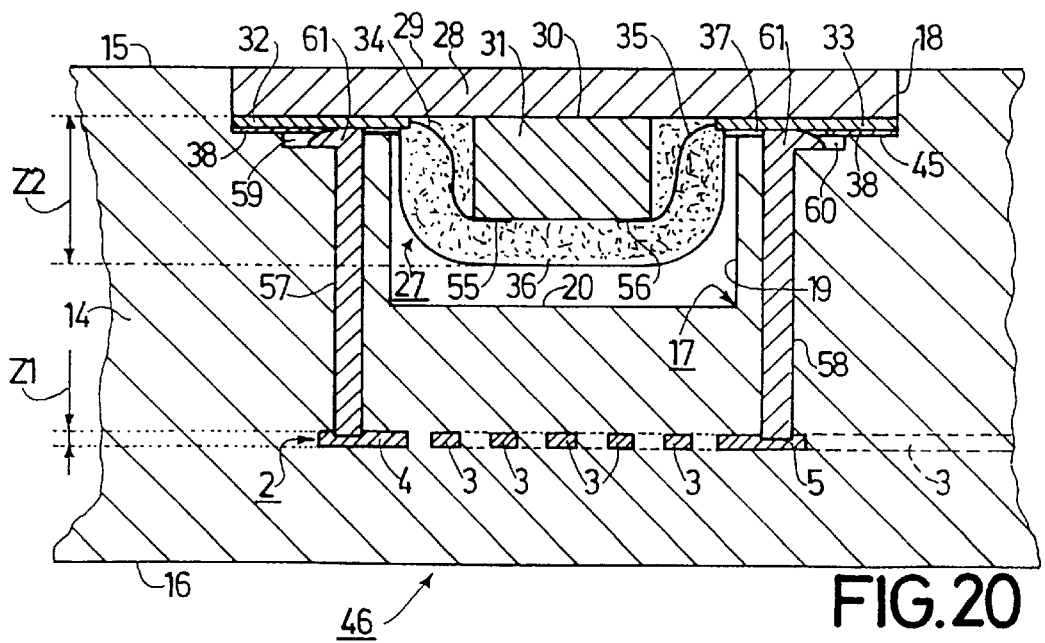
FIG. 20, in a manner similar to FIG. 19, shows the finished chip card with the module mounted in the recess, the card being shown only partly and to a scale four times as large as that of FIG. 19, the two module connecting contacts and the two coil connecting contacts being disposed opposite one another in a direction perpendicular to the body main surfaces and perpendicular to the carrier main surfaces and being connected to one another in an electrically conductive manner by means of an electrically conductive adhesive present in each channel.

Subsequently, in a further process step the module 27 is placed in the recess 17 by means of a bonding arm 39, shown diagrammatically in dash-dot lines in FIG. 18, with the chip 31 and the two module connecting contacts 32 and 33 facing forward in the direction indicated by the arrow 40. Towards the end of this placement operation the two flat module connecting contacts 32 and 33 engage the two passages 21 and 22 filled with the electrically conductive adhesive forming the electrically conductive connecting means 61. By means of the adhesive introduced into the two channels 57 and 58 an electrically conductive as well as mechanically rigid connection is formed between the two module connecting contacts 32 and 33 and the two coil connecting contacts 4 and 5. When the module 27 is placed into the recess 17 any surplus amount of electrically conductive adhesive 26 is urged out of the two channels 57 and 58 in the area of the two pockets 59 and 60, so that the surplus amount of electrically conductive adhesive is taken up in the two pockets 59 and 60, as is shown in FIGS. 19 and 20. After the module 27 has been placed into the recess 17 of the card body 14 the process situation illustrated in FIG. 19 is obtained. The edges of the plate-shaped carrier 28 of the module 27 are then enclosed by the recess 17 and the carrier 28 covers the chip 31 carried by it and the module connecting contacts 32 and 33 of the module 27.

In a further process step a heating die 43, represented diagrammatically by means of two arrows in FIG. 19, which die forms part of a heating device 44, represented diagrammatically in dash-dot lines in FIG. 19, is placed onto the first carrier main surface 29 of the carrier 28 in order to activate the hot-melt adhesive 38. Subsequently, heat is transferred from the applied heating die 43 to the hot-melt adhesive via the carrier 28, after which the heating die 43 is lifted off the carrier 43. During the subsequent cooling an adhesive joint is formed between the annular peripheral area 37 of the carrier 28 and the annular bounding surface 45 of the recess 17, which bounding surface extends parallel to the two body main surfaces 15 and 16, said adhesive joint thus securing the module 27 to the card body 14. To secure the module 27 to the card body 14 it is also possible to use an adhesive as employed in the so-called cold bonding technique.

Upon completion of the last-mentioned process step a finished chip card 46 forming a data carrier in accordance with a fourth embodiment of the invention intended exclusively for contactless uses is obtained. This chip card 46 is shown partly in FIG. 20.

Upon mounting of the module 27 in the recess 17 of the card body 14 the first carrier main surface 29 of the carrier 28 lies against the first body main surface 15 of the card body 14 and, in the present case, the first carrier main surface 29 is then flush with the first body main surface 15. Furthermore, the second carrier main surface 30 of the carrier 28 is then remote from the first body main surface 15 of the card body 14 and faces the second body main surface 16 of the card body 14. Moreover, the chip 31 forming the component is then situated in a component level zone Z2 of the card body 14, which component level zone extends transversely, in the present case perpendicularly, to the first body main surface 15 and, in the present case, also perpendicularly to the second body main surface 16 of the card body 14. In this case the component level zone Z2 is spaced at a distance D2 from the first body main surface 15. The distance D2 now has a value of approximately 100 $\mu$m. In the present case, in which the chip 31 is embedded in a package 36, the component level zone Z2 of the card body 14 extends over the entire height dimension of the package 36. In the case that a module is used in which the chip forming the component does not have a package, or in which the package is substantially flush with the chip, it is adequate if the component level zone Z2 extends only up to the end level zone of the chip, which area is remote from the second carrier main surface of the carrier.

As is apparent from FIG. 20, the chip card 46 has advantageously been constructed in such a manner that the coil turns 3 of the coil 2 and, in the present case also the two coil connecting contacts 4 and 5 of the coil 2, are disposed in a winding level zone Z1 situated outside the component level zone Z2 and that the two module connecting contacts 32 and 33 are properly connected to the two coil connecting contacts 4 and 5, both electrically and mechanically, through the component level zone Z2 and, in the present case, also beyond the component level zone Z2, by means of the electrically conductive adhesive which forms the electrically conductive connecting means 61 and which is present in the two channels 57 and 58. This construction has the advantage that—although the chip 31 and its package 36 as well as the two module connecting contacts 32 and 33 project from the same carrier main surface, i.e. the second carrier main surface 30 of the carrier 28 of the module 27—the presence of the chip 31 does not impose any restrictions on the arrangement of the coil turns 3 of the coil 2 and the construction of the coil 2 in the proximity of the chip 31 forming the component, because the chip 31 together with its package 36 is disposed in a completely other level zone than the coil turns 3 of the coil 2 and the two coil connecting contacts 4 and 5 of the coil 2. Since in the chip card 46 both the electrical connection between the module connecting contacts 32, 33 and the coil connecting contacts 4, 5 and the mechanical connection between these contacts are made by means of the electrically conductive adhesive which forms the electrically conductive connecting means 61, a reliable and aging-proof connection between the module connecting contacts 32, 33 and the coil connecting contacts 4, 5 is guaranteed.

Figure 21:
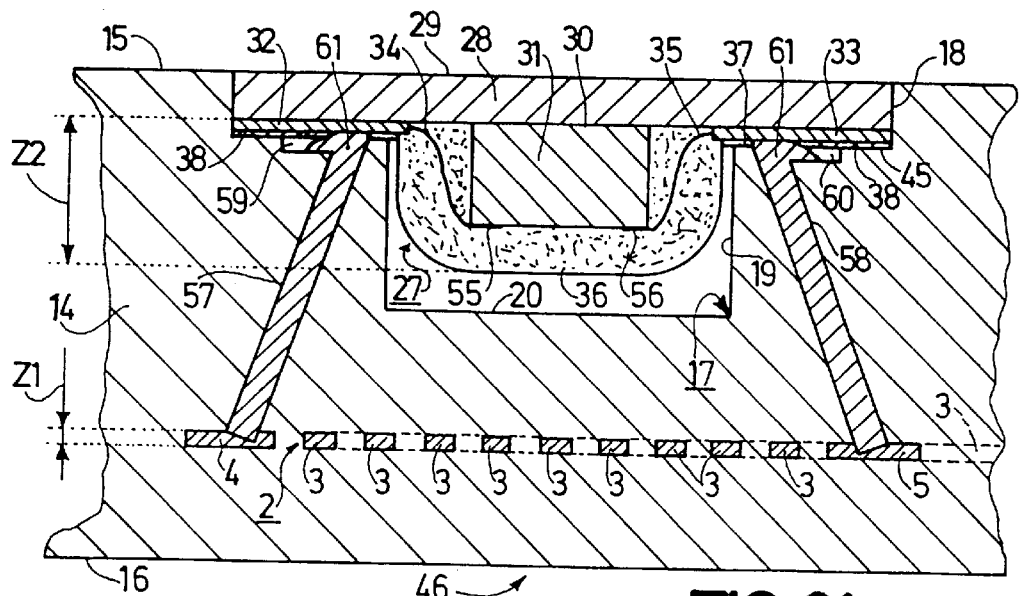
FIG. 21, in a manner similar to FIG. 20, shows the finished chip card as a data carrier in accordance with a second embodiment of the invention, which likewise comprises a laminated card body, the two module connecting contacts and the two coil connecting contacts being disposed opposite one another in a direction which is inclined with respect to the body main surfaces and with respect to the carrier main surfaces and being connected to one another in an electrically conductive manner by means of an electrically conductive adhesive present in each channel.

FIG. 21 shows a chip card 46 forming a card-shaped data carrier in accordance with a fifth embodiment of the invention intended exclusively for contactless uses. In this chip card 45 two channels 57 and 58 have been provided, which extend transversely to the first body main surface 15 and the second body main surface 16 of the card body 14 and, in the present case, they are inclined with respect to the two body main surfaces 15 and 16 in such a manner that the distance between the two channels 57 and 58 in the area of the two coil connecting contacts 4 and 5 is larger than in the area of the two module connecting contacts 34 and 35. This construction of the two channels has the advantage that a larger number of coil turns 3 can be arranged between the two coil connecting contacts 4 and 5 than in the case of a chip card 46 as shown in FIG. 20.

Figure 22:
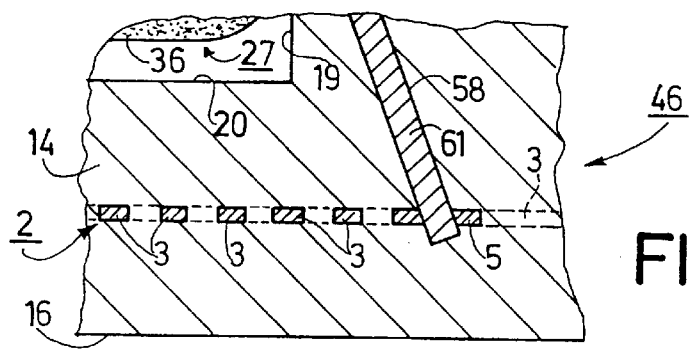
FIG. 22, in the same way as FIGS. 20 and 21, shows the finished chip card as a data carrier in accordance with a third embodiment of the invention, the card being shown only partly, which chip card has an injection-molded card body, the two module connecting contacts and the two coil connecting contacts being disposed opposite one another in a direction which is inclined with respect to the body main surfaces and with respect to the carrier main surfaces and being connected to one another in an electrically conductive manner by means of an electrically conductive adhesive present in each channel, the two channels extending through the two coil connecting contacts.

FIG. 22 shows a chip card 46 forming a card-shaped data carrier in accordance with a sixth embodiment of the invention intended exclusively for contactless uses. In this chip card 46 the two channels, of which only the channel 58 is shown in FIG. 22, are also inclined with respect to the first body main surface 15 and the second body main surface 16 of the chip card 46. In the chip card 46 shown in FIG. 2 both channels extend through the two coil connecting contacts, FIG. 22 showing only the coil connecting contact 5. The channels through the coil connecting contacts are formed in that during the fabrication of the chip card 46 the channels are milled out beyond the coil connecting contacts. The advantage of such a construction resides in the fact that the milling depth for the formation of the channels is comparatively non-critical and consequently requires a lower precision. By the introduction of the electrically conductive adhesive constituting the electrically conductive connecting means 61, which adhesive forms a firm bond with the coil connecting contacts which are traversed by the channels, it is achieved that also in this case a proper electrical and mechanical connection is realized between the coil connecting contacts and the module connecting contacts with the aid of the electrically conductive adhesive provided in the channels as the electrically conductive connecting means 61.

Figure 23:
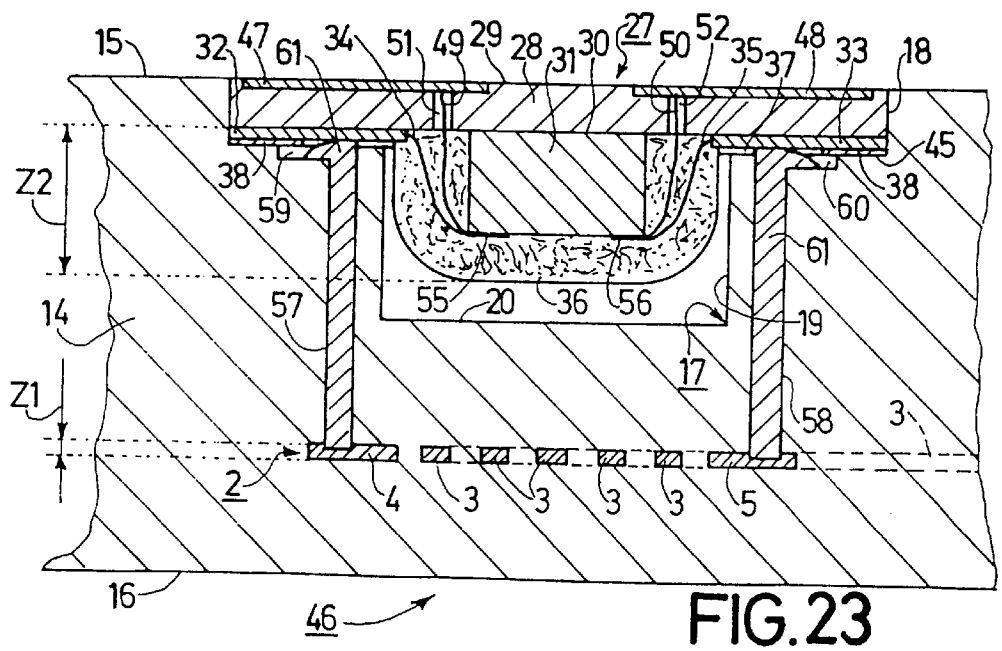
FIG. 23, in a manner similar to FIGS. 20 and 21, shows a finished chip card as a data carrier in accordance with a fourth embodiment of the invention, which chip card likewise comprises an injection-molded card body and has two module connecting contacts and two coil connecting contacts which are disposed opposite one another in a direction perpendicular to the body main surfaces and perpendicular to the carrier main surfaces, and which are connected to one another in an electrically conductive manner by means of an electrically conductive adhesive present in each channel, the carrier of the module in addition having further module connecting contacts which are accessible from the exterior.

FIG. 23 shows a chip card 46 forming a card-shaped data carrier in accordance with a seventh embodiment of the invention. In this chip card 46 the construction of the two channels 57 and 58 and the construction of the two coil connecting contacts 4 and 5 and the two module connecting contacts 32 and 33, which are connected to one another by means of the electrically conductive adhesive in the two channels 57 and 58, are identical to the construction of these chip card elements in the chip card 46 shown in FIG. 20.

In the chip card 46 as shown in FIG. 23, however, further module connecting contacts arranged in the area of the first carrier main surface 29 are connected to the carrier 28 of the module 27 and are adapted to cooperate with mating contacts with which they are engageable from outside the chip card 46. The chip card 46 of FIG. 23 has eight of such further module connecting contacts in total, only two of said further module connecting contacts 47 and 48 being shown in FIG. 23. As is shown for the two further module connecting contacts 47 and 48 in FIG. 23, the further module connecting contacts are connected to further chip connecting contacts (pads), not shown, of the chip 31 via further bonding wires, two of said further bonding wires 49 and 50 being shown in FIG. 23. The further bonding wires are passed through bores formed in the carrier 28, two of said bores 51 and 52 being shown in FIG. 23.

The chip 31 forming the component of the chip card 46 in FIG. 23 is a so-termed dual-purpose chip whose module connecting contacts 32 and 33 arranged in the area of the second carrier main surface 30 are connected to the coil connecting contacts 4 and 5 of the coil 2 provided for the contactless data exchange between the dual-purpose chip and a write/read station and, optionally, for the contactless transmission of power to the dual-purpose chip, and whose further module connecting contacts arranged in the area of the first carrier main surface 29 are adapted to provide the contact-bound data exchange between the dual-purpose chip and a write/read station for the contact-bound transmission of power to the dual-purpose chip.

In the chip card 46 as shown in FIG. 23 the component formed by the chip 31 including its package 36 and the coil 2 with its coil turns 3 and its two coil connecting contacts 4 and 5 are also disposed in different level zones, i.e. the component formed by the chip 31 including its package 36 is disposed in the component level zone Z2 and the coil 2 is disposed in the winding level zone Z1, which in the chip card 46 of FIG. 23 also yields the great advantage that— although the chip 31 and its package 36 as well as the two module connecting contacts 32 and 33 project from the same carrier main surface, i.e. the second carrier main surface 30 of the carrier 28 of the module 27—the presence of the chip 31 does not impose any restrictions on the arrangement of the coil turns 3 of the coil 2 and the construction of the coil 2 in the proximity of the chip 31.

In the card-shaped data carriers in accordance with the invention constructed as chip cards shown in FIGS. 20 to 23 the recesses 17 in the card bodies 15 are situated at a position on the card-shaped data carriers 46 for contactless uses correspond to the position of a contact surface, which consists of contacts, on a card-shaped data carrier for contact-bound uses in accordance with the standard ISO 7816-2, as a result of which these data carriers in accordance with the invention also have the advantages mentioned with reference to the data carrier shown in FIG. 9.

The invention is not limited to the embodiments described hereinbefore by way of examples. For example, for manufacturing a data carrier body and for forming a recess in the data carrier body it is also possible to use other suitable techniques, for example etching techniques or laser techniques. Other suitable techniques are also available for manufacturing the coils, for example etching techniques. Moreover, two or more than two coils may be incorporated in a data carrier body. A module mounted in a data carrier need not necessarily be a component in the form of a chip, but the component may alternatively be a capacitor, a pressure-sensitive film switch, or the like. Furthermore, it is to be noted that the component in a chip card forming a data carrier in accordance with the invention need not necessarily comprise a single chip but it may alternatively comprise two or more chips. A chip card may, for example, also include two modules each comprising one chip or, alternatively, one module comprising two chips. In the embodiments described hereinbefore the module carriers are accessible at the location of the first body main surface of the card body, the first carrier main surface and the first body main surface being flush in the chip cards in accordance with the three embodiments described above; however, it is possible to have a chip card in which the first carrier main surface of the carrier of a module is covered with a cover layer, the outer bounding surface of this cover layer then being flush with the first body main surface of the card body of this chip card. In the embodiments described above with reference to FIGS. 9, 10 and 11 each time one module connecting contact and one coil connecting contact are disposed opposite one another in a direction exactly perpendicular to the body main surfaces and exactly perpendicular to the carrier main surfaces; however, this is not necessary, but a module connecting contact and a coil connecting contact may also be disposed opposite one another in a direction which is inclined with respect to the body main surfaces and the carrier main surfaces, in which case the connecting contact which extends through the component level zone of the chip card is inclined with respect to the afore-mentioned main surfaces.

In a data carrier having an injection-molded data carrier and having a coil made of thin wire the coil turns and the coil connecting contacts can be disposed in one plane in such a manner that the coil connecting contacts as well as the coil turns are then disposed in a winding level zone Z1 over their whole extent, which zone corresponds to the wire diameter and is situated outside the component level zone Z2. This need not necessarily be so because the coil turns may also be disposed within the component level zone Z2 in their area which does not face and does not adjoin the component on the data carrier module, i.e. in a direction transverse to the body main surfaces of the module carrier, which can be achieved by a suitably bent or angled shape of the coil. In this respect it is essential that, at least in the area adjacent the component, the coil connecting contacts and the coil turns of the coil are disposed in a winding level zone Z1 outside the component level zone Z2.

Finally, an essential fact to be noted is that in all the embodiments of data carriers described within the scope of the present Application said body surface which bounds the data carrier body and in which the recess in which the module is mounted terminates is an externally accessible outer body surface. However, this need not be so because after the module has been mounted in data carriers in accordance with the described embodiments, in the case that this module has been provided in a data carrier exclusively for contactless operation, said body surface may be provided with a cover layer, for example in the form of a cover foil, which can wholly cover the module and, in the case of a module provided in a data carrier for contact-bound operation, it may cover the module in such a manner that at least the further module connecting contacts remain exposed to allow cooperation with contact pins of a read/write device, or it may not at all cover such a module but merely said body surface. In the case of a such a construction the outer body surface of the data carrier body of a data carrier is formed by the outer surface of the cover layer.

What is claimed is:

1. A card-shaped data carrier for contactless uses, comprising a card body having two opposite body main surfaces extending parallel to each other and having dimensions corresponding to the dimensions of a card body of a card-shaped data carrier for contact-bound uses in accordance with the standard ISO 7810, and incorporating into the card body at least one component for the contactless uses wherein said component comprises a chip embedded in an encapsulating resin package, which component has component connecting contacts, and at least one transmission device for the contactless uses, which transmission device has transmission-device connecting contacts, the component connecting contacts being connected to the transmission-device connecting contacts in an electrically conductive manner, and wherein the card body has a recess extending from one of said body main surfaces down to a recess bottom surface located between said two opposite body main surfaces, and the component for the contactless uses being mounted in said recess such that the chip and the resin encapsulating package are spaced from the recess bottom surface, and the recess in the card body is situated in the card-shaped data carrier for contactless uses at a position which corresponds to the position of a contact surface, which consists of contacts, on a card-shaped data carrier for contact-bound uses in accordance with the standard ISO 7816-2, and the component connecting contacts of the component are connected in an electrically conductive manner to the transmission-device connecting contacts of a transmission device incorporated in the card body before the component is mounted in the recess of the card body, and wherein said component connecting contacts that are electrically connected to said transmission-device connecting contacts are disposed at less than a right angle with respect to the main body surfaces of said data carrier so that each point of connection of a component connecting contact with its corresponding transmission-device connection contact is laterally displaced outwardly from the position of a point of connection of a component connecting contact disposed substantially perpendicularly to the main body surfaces of said data carrier, and wherein the distance between said two oppositely located points of contact is increased to allow a larger number of coils of the transmission device to be disposed in the area between said two oppositely located points of contact.

2. A data carrier as claimed in claim 1, wherein the component forms part of a module for the contactless uses, which module comprises a plate-shaped component carrier and the component carried by this component carrier and the module connecting contacts which have been connected to the component connecting contacts in an electrically conductive manner, and the module for the contactless uses has been mounted in the recess, and the module connecting contacts of the module have been connected to the transmission-device connecting contacts in an electrically conductive manner.

3. A data carrier as claimed in claim 2, wherein the plate-shaped component carrier has a first carrier main surface, which faces said body main surface, and a second carrier main surface, which is remote from said body main surface and extends substantially parallel to the first carrier main surface, and the module connecting contacts of the module are connected to the component carrier in the area of the second carrier main surface, and each module connecting contact of the module is disposed opposite a transmission-device connecting contact in a direction transverse to the second carrier main surface and two oppositely disposed connecting contacts are connected to one another in an electrically conductive manner.

4. A data carrier as claimed in claim 3, wherein the module connecting contacts of the module project from the second carrier main surface of the component carrier and extend to the transmission-device connecting contacts of the transmission device.

5. A data carrier as claimed in claim 4, wherein in a bottom area of the recess, which area is remote from said body main surface, passages have been formed which extend from the recess to the transmission-device connecting contacts, through which passages the module connecting contacts which project from the second carrier main surface of the component carrier are connected to the transmission-device connecting contacts in an electrically conductive manner.

6. A data carrier as claimed in claim 5, wherein an electrically conductive adhesive has been provided in the passages, by means of which adhesive the module connecting contacts and the transmission-device connecting contacts are connected to one another in an electrically conductive manner.

7. A data carrier as claimed in claim 4, wherein said module connecting contacts project beyond the level of the component in a direction perpendicular to and away from the second carrier main surface.

8. A data carrier as claimed in claim 2, wherein said plate-shaped component carrier has a first carrier main surface, which faces said body main surface, and a second carrier main surface, which is remote from said body main surface and extends substantially parallel to the first carrier main surface, and wherein the transmission-device connecting contacts extend substantially perpendicularly to the body main surfaces and also to the first and second carrier main surfaces such that the transmission-device connecting contacts project past the chip to reach the module connecting contacts of the module.

9. A data carrier as claimed in claim 3, wherein the module connecting contacts of the module are essentially disposed in the level zone of the second carrier main surface, and between each module connecting contact of the module and the opposite transmission-device connecting contact of the transmission device in a direction transverse to the second carrier main surface a channel is formed, which channel is enclosed by the card body over its whole length, adjoins the two connecting contacts and contains an electrically conductive connecting means for the electrically conductive connection of the two adjoining connecting contacts.

10. A data carrier as claimed as claimed in claim 9, wherein the data carrier has a stepped recess which terminates in said body main surface and has a cross-sectionally larger first recess portion, which adjoins said carrier main surface and is bounded by an annular bounding surface substantially parallel to said body main surface, and a cross-sectionally smaller second recess portion, which adjoins the first recess portion at the side which is remote from said body main surface and which accommodates the module, an annular portion of the second carrier main surface of the component carrier of the module facing the annular bounding surface of the first recess portion, and the module connecting contacts are disposed at least partly in the area of the annular portion of the second carrier main surface, and the channels extend from the annular bounding surface of the first recess portion up to the transmission-device connecting contacts through the card body.

11. A data carrier as claimed in claim 8, wherein each channel contains an electrically conductive adhesive as the electrically conductive connecting means.

12. A data carrier as claimed in claim 8, wherein at its end which is remote from its adjacent transmission-device connecting contact each channel is provided with a pocket which extends in a lateral direction away from the channel and which is adapted to receive a surplus amount of electrically conductive adhesive.

13. A data carrier as claimed in claim 1, wherein the transmission device is a coil.

14. A data carrier as claimed in claim 13, wherein the coil turns and the coil connecting contacts of the coil provided as transmission-device connecting contacts are constituted by conductor tracks formed in a screen-printing process.

15. A data carrier as claimed in claim 14, wherein the coil turns and the coil connecting contacts of the coil provided as transmission-device connecting contacts are constituted by conductor tracks formed in a screen-printing process using a conductive silver paste.

16. A data carrier as claimed in claim 1, wherein the card body having the recess is a laminated card body.

17. A method of manufacturing a data carrier for contactless uses, in which a card body having two opposite body main surfaces extending parallel to each other is manufactured, which card body has dimensions corresponding to the dimensions of a card body of a card-shaped data carrier for contact-bound uses in accordance with the standard ISO 7810, and in which during the manufacture of the card body at least one component for the contactless uses and having component connecting contacts is incorporated in the card body wherein said component comprises a chip embedded in an encapsulating resin package, at and least one transmission device having transmission-device connecting contacts also is incorporated in the card body, and including the steps of:

forming a recess in the manufactured card body by material removal from the card body wherein said recess extends from one of said body main surfaces down to a recess bottom surface located between said two opposite body main surfaces and the recess is situated at a position which corresponds to the position of a contact surface, which consists of contacts, on a card-shaped data carrier for contact-bound uses in accordance with the standard ISO 7816-2, incorporating the transmission device, which is separate from the component, in the card body before mounting of the component in the card body, mounting the component for the contactless uses in said recess such that the chip and the resin encapsulating package are spaced from the recess bottom surface, and the component connecting contacts and the transmission-device connecting contacts are connected to one another in an electrically conductive manner card body before the component is mounted in the recess of the card body, extending said component connecting contacts that are electrically connected to said transmission-device connecting contacts at less than a right angle with respect to the main body surfaces of said data carrier so that each point of connection of a component connecting contact with its corresponding transmission-device connection contact is laterally displaced outwardly from the position of a point of connection of a component connecting contact disposed substantially perpendicularly to the main body surfaces of said data carrier, such that said outwardly displaced component connecting contacts enclose a larger number of coils of the transmission device in the area between said outwardly displaced component connecting contacts.

18. A method as claimed in claim 17, wherein for the component to be mounted in the recess of the card body a component is used which forms part of a module for the contactless uses, which module comprises a plate-shaped component carrier and the component carried by this component carrier and the module connecting contacts which have been electrically connected to the component connecting contacts, and the module for the contactless uses is mounted in the recess, and the module connecting contacts of the module are connected to the transmission-device connecting contacts in an electrically conductive manner.

19. A method as claimed in claim 18, wherein for the module to be mounted in the recess of the card body a module is used having a plate-shaped component carrier which has a first carrier main surface and a second carrier main surface, which is substantially parallel to the first carrier main surface, and in which the module connecting contacts of the module have been connected to the component carrier in the area of the second carrier main surface, and this module is mounted in the recess with the second carrier main surface and the module connecting contacts facing forward, and each module connecting contact of the module is connected in an electrically conductive manner to a transmission-device connecting contact disposed opposite said module connecting contact in a direction transverse to the second carrier main surface.

20. A method as claimed in claim 19, wherein the module to be mounted in the recess of the card body is a module in which the module connecting contacts of the module project from the second carrier main surface of the component carrier, and in a bottom area of the recess, which area is remote from said body main surface, two passages are formed which extend from the recess to the transmission-device connecting contacts, and when the module is mounted in the recess the projecting module connecting contacts are connected to the transmission-device connecting contacts in an electrically conductive manner through the passages.

21. A method as claimed in claim 20, wherein before the module is mounted in the recess a test device for testing whether the transmission device is in good working order is operationally connected to the transmission-device connecting contacts via the recess and the passages.

22. A method as claimed in claim 20, wherein before the module is mounted in the recess an electrically conductive adhesive is introduced into the passages.

23. A method as claimed in claim 21, wherein said module connecting contacts project beyond the level of the component in a direction perpendicular to and away from the second carrier main surface.

24. A method as claimed in claim 19, wherein the module to be mounted in the recess of the card body is a module in which the module connecting contacts are essentially disposed in the level zone of the second carrier main surface, and a stepped recess is formed in the manufactured card body by material removal, which recess terminates in said body main surface and has a cross-sectionally larger first recess portion, which adjoins said carrier main surface and is bounded by an annular bounding surface substantially parallel to said body main surface, and a cross-sectionally smaller second recess portion, which adjoins the first recess portion at the side which is remote from said body main surface, and channels are formed in the manufactured card body by material removal, which channels each extend from the annular bounding surface of the first recess portion up to a transmission-device connecting contact through the card body, and when the module is mounted in the recess each module connecting contact connected to the component carrier of the module is connected in an electrically conductive manner to a transmission-device connecting contact disposed opposite said module connecting contact by means of an electrically conductive connecting means previously introduced into a channel.

25. A method as claimed in claim 24, wherein before the module is mounted in the recess a test device for testing whether the transmission device is in good working order is operationally connected to the transmission-device connecting contacts via the channels.

26. A method as claimed in claim 24, wherein before the module is mounted in the recess an electrically conductive adhesive is introduced into each channel as the electrically conductive connecting means.

27. A method as claimed in claim 20, wherein before the module is mounted in the recess a hot-melt adhesive is applied in a peripheral area of the second carrier main surface of the component carrier of the module and after the module has been mounted in the recess a heating die of a heating device is placed onto the first carrier main surface of the carrier of the module to activate the hot-melt adhesive.

28. A method as claimed in claim 18, wherein as transmission device a coil is formed.

29. A method as claimed in claim 28, wherein the coil turns and the coil connecting contacts provided as transmission-device connecting contacts are formed on a carrier foil and subsequently the carrier foil, with the coil turns and the coil connecting contacts of the coil formed on said foil, is stacked with at least one further foil, the coil turns and the coil connecting contacts of the coil then being interposed between the carrier foil and a cover foil, and subsequently the stacked foils are laminated by means of a lamination process in order to form the card body.

30. A method as claimed in claim 29, wherein the coil turns and the coil connecting contacts of the coil are formed by depositing a conductive material on the carrier foil in a screen-printing process.

31. A method as claimed in claim 30, wherein the coil turns and the coil connecting contacts of the coil are formed by depositing a conductive silver paste on the carrier foil in a screen-printing process.

32. A method as claimed in claim 28, wherein a polycarbonate foil is used as the carrier foil on which the coil turns and the coil connecting contacts of the coil are formed.

33. A method as claimed in claim 32, wherein a polyvinyl chloride foil is used as the cover foil which directly adjoins the coil turns and the coil connecting contacts of the coil during stacking of the foils.

* * * * *